(12) United States Patent
Park et al.

(10) Patent No.: US 9,685,450 B2
(45) Date of Patent: *Jun. 20, 2017

(54) SEMICONDUCTOR DEVICES AND METHODS OF FABRICATING THE SAME

(71) Applicant: Samsung Electronics Co., Ltd., Suwon-si, Gyeonggi-do (KR)

(72) Inventors: Ki-Yeon Park, Hwaseong-si (KR); Jae-Hyoung Choi, Hwaseong-si (KR); Vladimir Urazaev, Suwon-si (KR); Jin-Ha Jeong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/072,521

(22) Filed: Mar. 17, 2016

(65) Prior Publication Data

US 2016/0197081 A1 Jul. 7, 2016

Related U.S. Application Data

(63) Continuation of application No. 14/708,423, filed on May 11, 2015, now Pat. No. 9,324,781, which is a
(Continued)

(30) Foreign Application Priority Data

Mar. 5, 2013 (KR) ........................ 10-2013-0023460

(51) Int. Cl.
*H01L 21/20* (2006.01)
*H01L 27/108* (2006.01)
*H01L 49/02* (2006.01)
*H01L 21/283* (2006.01)
*H01L 21/311* (2006.01)
*H01L 21/768* (2006.01)

(52) U.S. Cl.
CPC ........ *H01L 27/1085* (2013.01); *H01L 21/283* (2013.01); *H01L 21/311* (2013.01);
(Continued)

(58) Field of Classification Search
CPC ............ H01L 27/108; H01L 27/10852; H01L 27/0629; H01L 27/0682; H01L 27/0727;
(Continued)

(56) References Cited

U.S. PATENT DOCUMENTS 7,026,208 B2 4/2006 Park et al.
8,017,491 B2 9/2011 Lee et al.
(Continued)

FOREIGN PATENT DOCUMENTS

JP 2011-233561 11/2011
KR 100771540 B1 10/2007
(Continued)

*Primary Examiner* — Brook Kebede
(74) *Attorney, Agent, or Firm* — Ward and Smith, P.A.

(57) ABSTRACT

Provided are semiconductor devices and methods of fabricating the same. The methods may include forming a molding layer on a semiconductor substrate. A storage electrode passing through the molding layer is formed. A part of the storage electrode is exposed by partially etching the molding layer. A sacrificial oxide layer is formed by oxidizing the exposed part of the storage electrode. The partially-etched molding layer and the sacrificial oxide layer are removed. A capacitor dielectric layer is formed on the substrate of which the molding layer and the sacrificial oxide layer are removed. A plate electrode is formed on the capacitor dielectric layers.

12 Claims, 22 Drawing Sheets

Related U.S. Application Data continuation of application No. 14/193,071, filed on Feb. 28, 2014, now Pat. No. 9,059,331.

(52) U.S. Cl.
CPC ...... *H01L 21/76802* (2013.01); *H01L 27/108* (2013.01); *H01L 27/10852* (2013.01); *H01L 28/60* (2013.01); *H01L 28/92* (2013.01)

(58) Field of Classification Search
CPC .............. H01L 27/0733; H01L 27/0788; H01L 27/0794; H01L 28/60; H01L 28/92
USPC ........ 438/238, 239, 250, 254, 393, 396, 398
See application file for complete search history.

(56) References Cited

U.S. PATENT DOCUMENTS

| | | |
|---|---|---|
| 8,119,476 B2 | 2/2012 | Kang et al. |
| 2003/0008417 A1 | 1/2003 | Suzuki |
| 2006/0270177 A1 | 11/2006 | Park et al. |
| 2006/0292817 A1 | 12/2006 | Park et al. |
| 2007/0032013 A1 | 2/2007 | Yoon et al. |
| 2007/0059941 A1* | 3/2007 | Park .................... H01L 21/0206 438/745 |
| 2007/0170488 A1* | 7/2007 | Ryu ....................... H01L 28/91 257/308 |
| 2011/0024874 A1 | 2/2011 | Park et al. |
| 2012/0112317 A1 | 5/2012 | Kang et al. |

FOREIGN PATENT DOCUMENTS

| | | |
|---|---|---|
| KR | 1020070110747 A | 11/2007 |
| KR | 1020080086681 A | 9/2008 |
| KR | 1020090099775 A | 9/2009 |
| KR | 1020100079828 A | 7/2010 |
| KR | 1020100093925 A | 8/2010 |
| KR | 1020110074105 A | 6/2011 |
| KR | 1020110078020 A | 7/2011 |

\* cited by examiner

SEMICONDUCTOR DEVICES AND METHODS OF FABRICATING THE SAME

CROSS-REFERENCE TO RELATED APPLICATION

This U.S. non-provisional patent application is a continuation of U.S. patent application Ser. No. 14/708,423, filed May 11, 2015, which is a continuation application of U.S. application Ser. No. 14/193,071, filed Feb. 28, 2014, which in turn claims priority under 35 U.S.C. §119 to Korean Patent Application No. 10-2013-0023460 filed on Mar. 5, 2013, the disclosures of which are hereby incorporated by reference in their entirety.

BACKGROUND

Embodiments of the inventive concept relate to semiconductor devices including a capacitor, and methods of fabricating the semiconductor devices. Some embodiments of the inventive concept also relate to semiconductor modules and electronic systems employing the semiconductor devices and the methods.

As the integration of a semiconductor device increases, a distance between storage electrodes of capacitors may become very narrow.

SUMMARY

Embodiments of the inventive concept provide semiconductor devices having a capacitor.

Other embodiments of the inventive concept provide methods of forming storage electrodes that configure capacitors of a semiconductor device in such a way that distances between the storage electrodes are constant.

Still other embodiments of the inventive concept provide methods of fabricating a semiconductor device without deformation of storage electrodes.

Still other embodiments of the inventive concept provide semiconductor devices, a semiconductor module, electronic system, and mobile device having one or more of the semiconductor devices.

The technical objectives of the inventive concept are not limited to the above disclosure; other objectives may become apparent to those of ordinary skill in the art based on the following descriptions.

In accordance with an aspect of the inventive concept, methods of fabricating a semiconductor device include forming a molding layer on a semiconductor substrate, forming a storage electrode passing through the molding layer, exposing a part of the storage electrode by partially etching the molding layer, forming a sacrificial oxide layer by oxidizing the exposed part of the storage electrode, removing the partially-etched molding layer and the sacrificial oxide layer, forming a capacitor dielectric layer on the substrate of which the molding layer and the sacrificial oxide layer are removed, and forming a plate electrode on the capacitor dielectric layer.

In accordance with another aspect of the inventive concept, methods of fabricating a semiconductor device include forming a stopping insulating layer on a semiconductor substrate, forming a molding layer on the stopping insulating layer, forming storage electrodes passing through the molding layer and the stopping insulating layer, exposing parts of the storage electrodes by firstly partially etching the molding layer, forming a first sacrificial oxide layer by oxidizing the exposed parts of the storage electrodes to increase the distances between the exposed parts of the storage electrodes, and removing the firstly partially-etched molding layer and the first sacrificial oxide layer.

In accordance with still another aspect of the inventive concept, a semiconductor device includes a semiconductor substrate, a storage electrode structure disposed on the semiconductor substrate, a capacitor dielectric layer disposed on the storage electrode structure, and a plate electrode disposed on the capacitor dielectric layer. The storage electrode structure includes a storage conductive pattern and a core buried structure. The storage conductive pattern is formed of a first conductive material and surrounds side and bottom surfaces of the core buried structure. The core buried structure includes a core oxide pattern formed of an oxide of the first conductive material.

In accordance with still another aspect of the inventive concept, a semiconductor device includes a semiconductor substrate, storage electrode structures disposed on the semiconductor substrate, a supporter pattern connecting upper parts of the storage electrode structures, a capacitor dielectric layer disposed on the storage electrode structures and the supporter pattern, and a plate electrode disposed on the capacitor dielectric layer. Each of the storage electrode structures includes a storage conductive pattern and a core buried structure. The storage conductive pattern is formed of a first conductive material. The core buried structure includes a core oxide pattern formed of an oxide of the first conductive material.

Some embodiments include a semiconductor device that includes a semiconductor substrate, a first electrode structure disposed on the semiconductor substrate and that comprises a first conductive pattern and a core buried structure. The first conductive pattern includes a first conductive material that surrounds side surfaces of the core buried structure. The core buried structure includes a core oxide pattern that is an oxide of the first conductive material. The device includes a dielectric layer disposed on the first electrode structure and a plate electrode disposed on the dielectric layer.

In some embodiments, the first electrode structure comprises a first electrode and a second electrode. The device further includes a supporter pattern that connects upper portions of the first electrode and the second electrode. Some embodiments provide that the supporter pattern connects side surfaces of upper portions of the first electrode and the second electrode.

Some embodiments provide that the core buried structure further includes a core buried pattern on the core oxide pattern and that the core oxide pattern is interposed between the core buried pattern and the first conductive pattern. In some embodiments, the core buried pattern includes a metal, a metal nitride, and/or a metal oxide. Some embodiments provide that the core buried pattern includes a second conductive material having a greater hardness than the first conductive material.

In some embodiments, the first conductive pattern includes a recessed part of which a top is open and the core oxide pattern substantially fills the recessed part of the first conductive pattern. Some embodiments provide that an upper surface of the core oxide pattern is located at a lower level than that of the first conductive pattern.

Details of other embodiments are included in the detailed description and drawings.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The foregoing and other features and advantages of the inventive concepts will be apparent from the more particular description of some embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION

Figure 1:
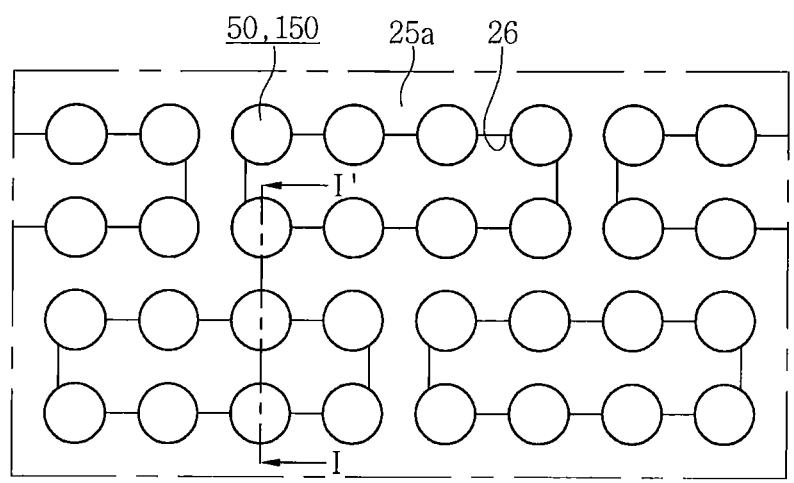
FIG. 1 is a layout showing a semiconductor device in accordance with some embodiments of the inventive concept.

The inventive concept will now be described more fully hereinafter with reference to the accompanying drawings, in which embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the sizes and relative sizes of layers and regions may be exaggerated for clarity. Like reference numerals refer to like elements throughout.

Embodiments of the inventive concept are described herein with reference to cross-section and plan illustrations that are schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concept.

In the drawings, the thicknesses of layers and regions may be exaggerated for clarity. It will also be understood that when a layer is referred to as being "on" another layer or substrate, it can be directly on the other layer or substrate or intervening layers may also be present. Like numbers refer to like elements throughout.

Spatially relative terms, such as "top end", "bottom end", "top surface", "bottom surface", "upper", "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of lower and upper. The device may be otherwise oriented (rotated 90 degrees or at other orientations) and the spatially relative descriptors used herein interpreted accordingly.

It will be understood that, although the terms "upper", "middle", "lower", etc. may be used herein to describe relative positions of elements, such elements should not be construed as limited by these terms. For example, an upper element could be termed a first element, a middle element could be termed a second element, and a lower element could be termed a third element, without departing from the scope of the inventive concept.

It will be understood that, although the terms first, second, A, B, etc. may be used herein in reference to elements of the inventive concept, such elements should not be construed as limited by these terms. For example, a first element could be termed a second element, and a second element could be termed a first element, without departing from the scope of the inventive concept.

The terminology used herein to describe embodiments of the inventive concept is not intended to limit the scope of the inventive concept.

The articles "a," "an," and "the" are singular in that they have a single referent, however the use of the singular form in the present document should not preclude the presence of more than one referent. In other words, elements of the inventive concept referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Figure 2A:
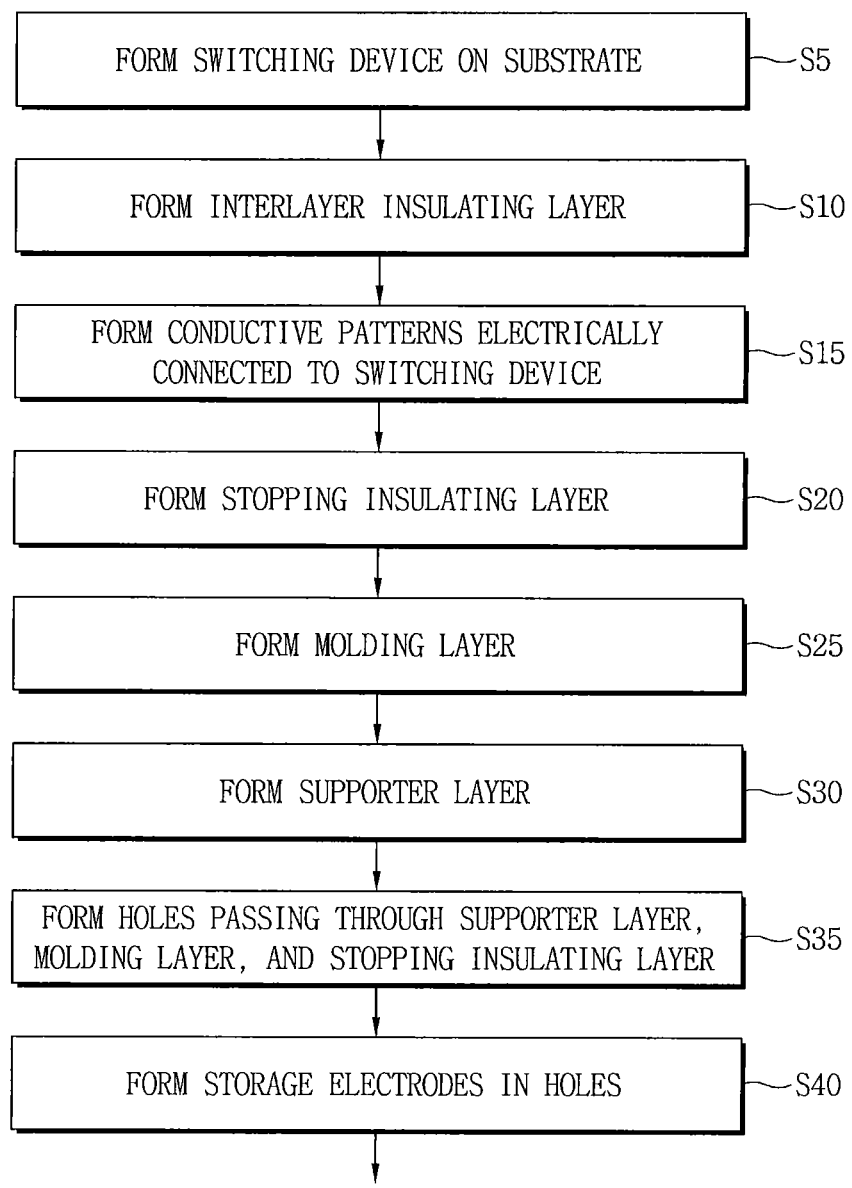
FIGS. 2A and 2B are process flowcharts showing methods of fabricating a semiconductor device in accordance with some embodiments of the inventive concept.
Figure 2B:
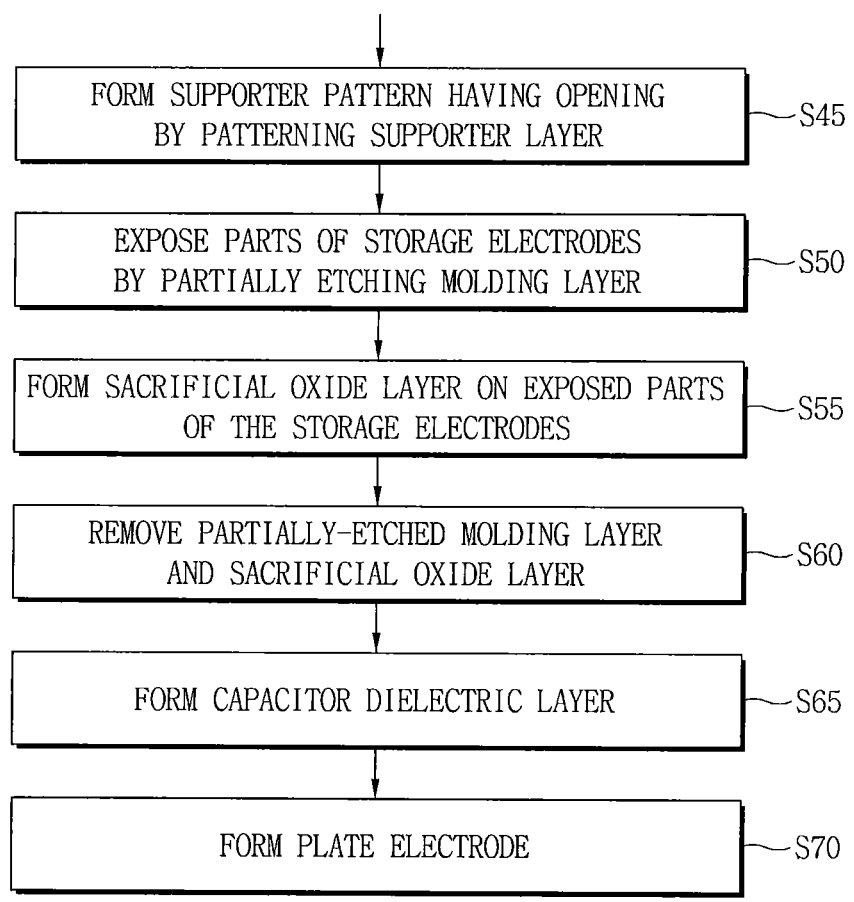

Unless otherwise defined, all terms (including technical and scientific terms) used herein are to be interpreted as is customary in the art to which this inventive concept belongs. It will be further understood that terms in common usage should also be interpreted as is customary in the relevant art and not in an idealized or overly formal sense unless expressly so defined herein FIG. 1 is a layout showing a semiconductor device in accordance with some embodiments of the inventive concept. FIGS. 2A and 2B are process flowcharts showing methods of fabricating a semiconductor device in accordance with some embodiments of the inventive concept, and FIGS. 3A to 3H are cross-sectional views showing an area taken along line I-I' of FIG. 1 for describing methods of fabricating a semiconductor device in accordance with some embodiments of the inventive concept.

Methods of fabricating a semiconductor device in accordance with some embodiments of the inventive concept will be described with reference to FIGS. 1, 2A and 2B, and 3A to 3H.

Figure 3A:
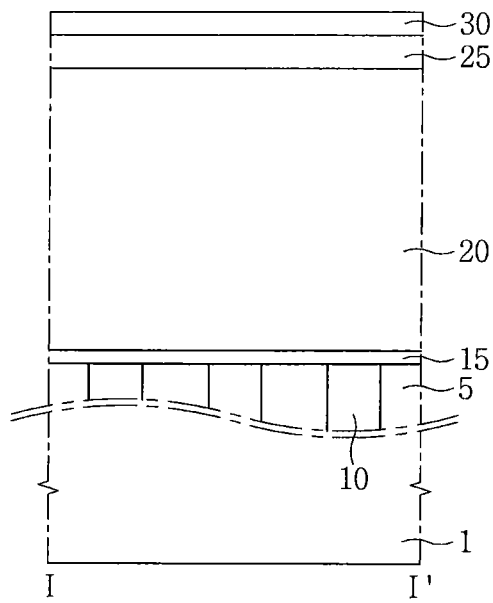
FIGS. 3A to 3H are cross-sectional views showing methods of fabricating a semiconductor device in accordance with some embodiments of the inventive concept.

Referring to FIGS. 1, 2A, and 3A, a substrate 1 may be prepared. The substrate 1 may be a semiconductor substrate formed of a semiconductor material such as silicon. A switching device may be formed on the substrate 1 (block 1105). The switching device may be a cell transistor of a memory device such as a DRAM.

An interlayer insulating layer 5 may be formed on the substrate 1 having the switching device (block 1110). The interlayer insulating layer 5 may be formed of silicon oxide. Conductive patterns 10 passing through the interlayer insulating layer 5 and electrically connected to the switching device may be formed (block 1115). When the switching device is a cell transistor, the conductive patterns 10 may be electrically connected to one of a source area and drain area of the cell transistor.

A stopping insulating layer 15 may be formed on the interlayer insulating layer 5 (block 1120). The stopping insulating layer 15 may cover the conductive patterns 10. The stopping insulating layer 15 may be formed of a different material from the interlayer insulating layer 5. The stopping insulating layer 15 may be formed of a material having an etch selectivity with respect to the interlayer insulating layer 5. For example, the interlayer insulating layer 5 may be formed of silicon oxide, and the stopping insulating layer 15 may be formed of silicon nitride.

A molding layer 20 may be formed on the stopping insulating layer 15 (block 1125). The molding layer 20 may be formed by performing a deposition process or a coating process. The molding layer 20 may be formed of a material having an etch selectivity with respect to the stopping insulating layer 15. For example, the stopping insulating layer 15 may be formed of silicon nitride, and the molding layer 20 may be formed of silicon oxide.

A supporter layer 25 may be formed on the molding layer 20 (block 1130). The supporter layer 25 may be formed by performing a deposition process. The supporter layer 25 may be formed of a material having an etch selectivity with respect to the molding layer 20. The molding layer 20 may be formed of silicon oxide, and the supporter layer 25 may be formed of silicon nitride.

A buffer layer 30 may be formed on the supporter layer 25. The buffer layer 30 may be formed of a different material from the supporter layer 25. For example, the buffer layer 30 may be formed of silicon oxide and/or polysilicon.

Figure 3B:
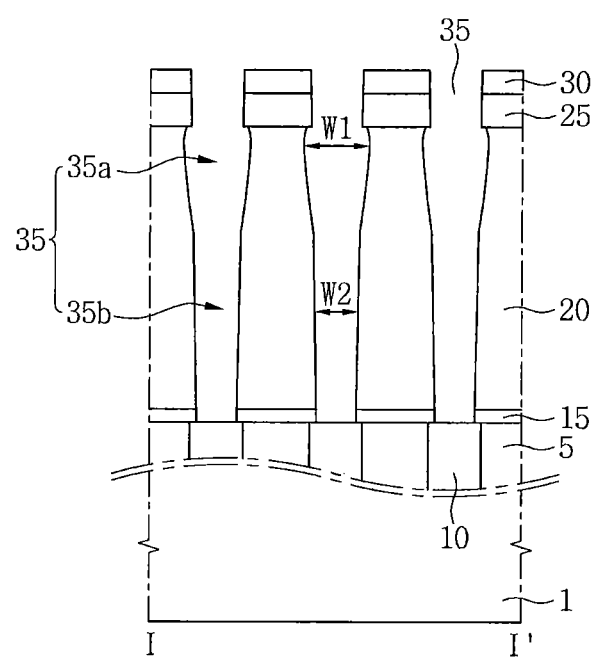

Referring to FIGS. 1, 2A, and 3B, holes 35 passing through the buffer layer 30, the supporter layer 25, the molding layer 20, and the stopping insulating layer 15 may be formed (block 1135). The holes 35 may be formed by performing a dry-etch process. Each of the holes 35 may include first and second parts 35a and 35b in the molding layer 20. In the holes 35, the second part 35b may be located under the first part 35a. In the holes 35, the first part 35a may have a first width W1, and the second part 35b may have a second width W2 that is smaller than the first width W1. In the holes 35, the first width W1 of the first part 35a may be the maximum width of the holes 35.

Figure 3C:
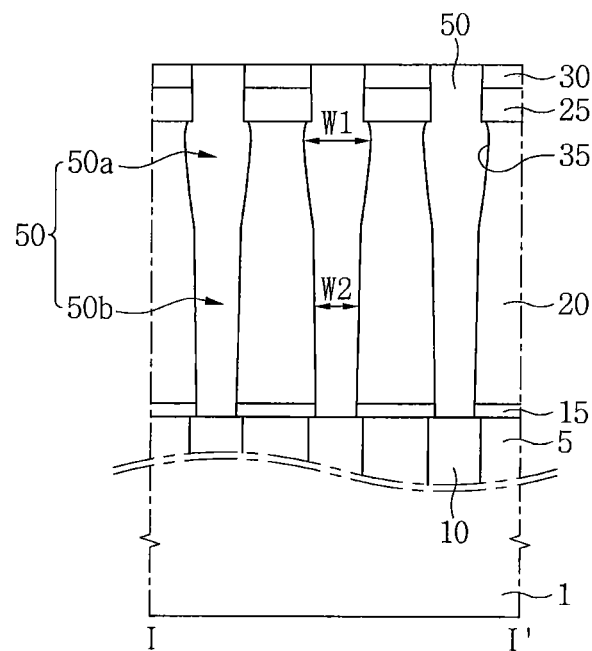

Referring to FIGS. 1, 2A, and 3C, storage electrodes 50 may be formed in the holes 35 (block 1140). The storage electrodes 50 may fill the holes 35. The formation of the storage electrodes 50 may include forming a conductive material on the substrate having the holes 35, and planarizing the conductive material until the buffer layer 30 is exposed. The planarization may be performed using an etch-back process and/or a chemical-mechanical planarization process. The storage electrodes 50 may be formed of a conductive material such as a metal and/or a metal nitride. For example, the storage electrodes 50 may be formed of titanium nitride. The storage electrodes 50 may be formed to vertically pass through the stopping insulating layer 15, the molding layer 20, and the buffer layer 30.

Each of the storage electrodes 50 may include a first part 50a and a second part 50b surrounded by the molding layer 20. In the storage electrodes 50, the first part 50a may be formed above the second part 50b. In storage electrodes 50, the first part 50a may be closer to the supporter layer 25 than the second part 50b. In the storage electrodes 50, the first part 50a may have a first width W1, and the second part 50b may have a second width W2 that is smaller than the first width W1. In the storage electrodes 50, the first width W1 of the first part 35a may be the maximum width of the holes 35. In the storage electrodes 50, the distance between the first parts 50a may be smaller than that between the second parts 50b.

Figure 3D:
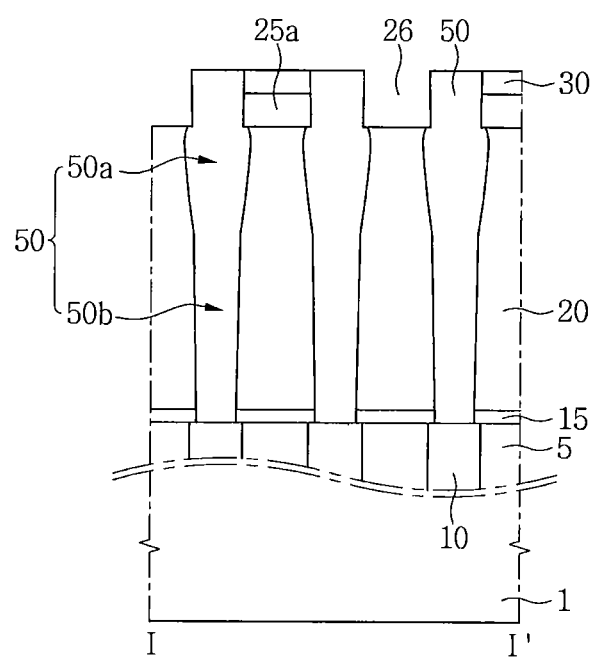

Referring to FIGS. 1, 2B, and 3D, a supporter pattern 25a having an opening 26 may be formed by patterning the supporter layer 25 (block 1145). The supporter pattern 25a may be connected to side surfaces of the storage electrodes 50. The opening 26 may expose a part of the molding layer 20. The buffer layer 30 may also be patterned while the supporter pattern 25a is formed.

Figure 3E:
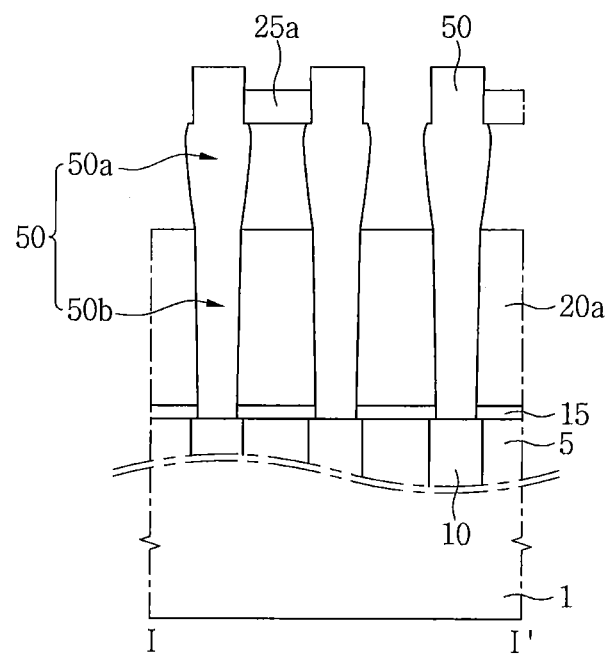

Referring to FIGS. 1, 2B, and 3E, parts of the storage electrodes 50 may be exposed by partially etching the molding layer 20 (block 1150). The first parts 50a of the storage electrodes 50 may be exposed while the molding layer 20 is partially etched. The partially-etched molding layer 20a may remain to surround side surfaces of the second parts 50b of the storage electrodes 50. A lower surface of the supporter pattern 25a may be exposed while the molding layer 20 is partially etched.

In some embodiments, when the buffer layer 30 is formed of the same kind of oxide as the molding layer 20, the buffer layer 30 may also be etched and removed while the molding layer 20 is partially etched.

In other embodiments, when the buffer layer 30 is formed of a different material from the molding layer 20, the buffer layer 30 may be etched and removed using an etch process before or after the molding layer 20 is partially etched.

Figure 3F:
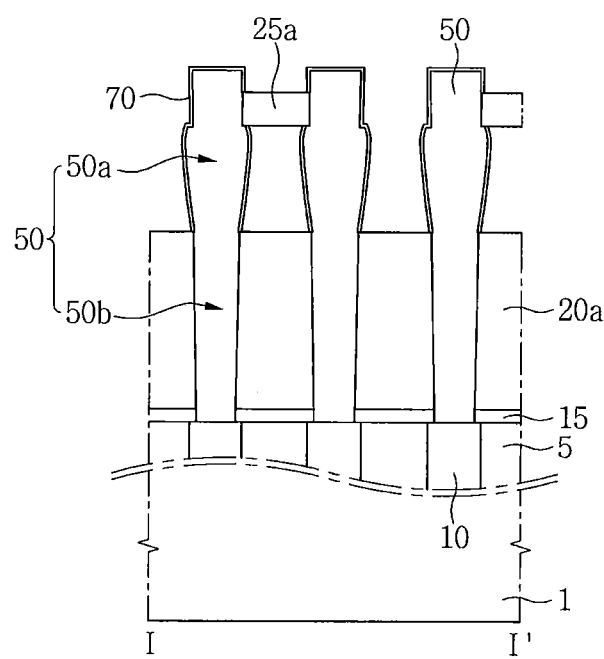

Referring to FIGS. 1, 2B, and 3F, a sacrificial oxide layer 70 may be formed on the exposed parts of the storage electrodes 50 (block 1155). The sacrificial oxide layer 70 may be formed by oxidizing the exposed parts of the storage electrodes 50. When the storage electrodes 50 are formed of a metal material, the sacrificial oxide layer 70 may be formed of an oxide of the metal material, and when the storage electrodes 50 are formed of a metal nitride, the sacrificial oxide layer 70 may be formed of an oxide of the metal nitride. When the storage electrodes 50 are formed of TiN, the sacrificial oxide layer 70 may be formed of TiON.

In some embodiments, the formation of the sacrificial oxide layer 70 may include exposing the substrate having the partially-etched molding layer 20*a* to air including oxygen, and thereby naturally oxidizing the exposed parts of the storage electrodes 50.

In other embodiments, the formation of the sacrificial oxide layer 70 may include oxidizing the exposed parts of the storage electrodes 50 by performing an oxidation process with respect to the partially-etched molding layer 20*a*. For example, the oxidation process may be performed under a process gas atmosphere including oxygen or ozone at a higher temperature than room temperature.

Figure 3G:
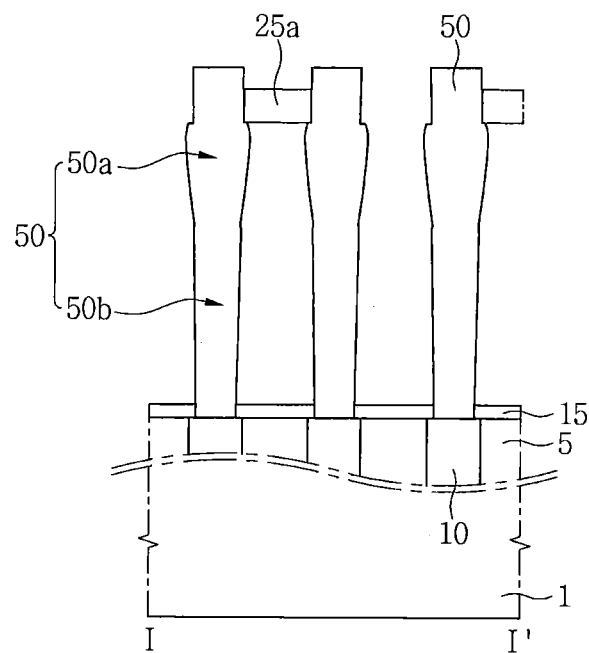

Referring to FIGS. 1, 2B, and 3G, the partially-etched molding layer 20*a* and the sacrificial oxide layer 70 may be removed using an etch process (block 1160). The partially-etched molding layer 20*a* and the sacrificial oxide layer 70 may be removed by an oxide-etch process. The removal of the partially-etched molding layer 20*a* and the sacrificial oxide layer 70 may include performing a wet-etch process using HF. By removing the partially-etched molding layer 20*a* and the sacrificial oxide layer 70, surfaces of the stopping insulating layer 15 and the storage electrodes 50 may be more exposed.

Since the sacrificial oxide layer 70 may be formed by growing from the storage electrodes 50, the width of the storage electrodes 50 may decrease, and the distance between the storage electrodes 50 may increase. Accordingly, since the distance between the storage electrodes 50 increases, bending deformation of the storage electrodes 50 caused by the storage electrodes 50, which are formed of a conductive material, being attracted to each other when the partially-etched molding layer 20*a* and the sacrificial oxide layer 70 are removed, may be suppressed.

Figure 3H:
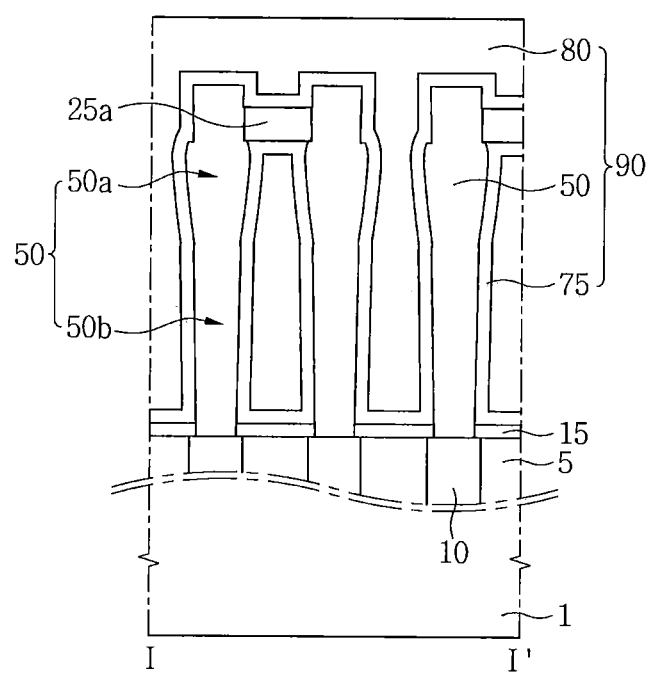

Referring to FIGS. 1, 2B, and 3H, a capacitor dielectric layer 75 may be formed on the substrate having the exposed storage electrodes 50 (block 1165). The capacitor dielectric layer 75 may be conformally formed on the exposed substrate after the partially-etched molding layer 20*a* and the sacrificial oxide layer 70 are removed. The formation of the capacitor dielectric layer 75 may include conformally forming a dielectric material on exposed surfaces of the storage electrodes 50, stopping insulating layer 15, and supporter pattern 25*a*. The capacitor dielectric layer 75 may include a TaO layer, a TaON layer, an AlO layer, a HfO layer, a ZrO layer, a TiO layer, a BST((Ba,Sr)TiO) layer, a STO(SrTiO) layer, a BTO(BaTiO) layer, a PZT(Pb(Zr,Ti)O) layer, a (Pb,La)(Zr,Ti)O layer, a Ba(Zr,Ti)O layer, a Sr(Zr,Ti)O layer, and/or a combination thereof.

The distance between the storage electrodes 50 may increase while dividedly etching the molding layer 20, and forming and removing the sacrificial oxide layer 70. Accordingly, bending deformation of the storage electrodes 50 occurring while removing the molding layer 20 by an etch process and/or forming a dielectric material for forming the capacitor dielectric layer 75, may be prevented. Therefore, since the distance between the storage electrodes 50 increases, and the storage electrodes 50 are formed without the bending deformation, it is possible to design the distance between the storage electrodes 50 to be narrower, and thereby increase integration of a semiconductor device and fabricate a scaled-down product.

A plate electrode 80 may be formed on the substrate having the capacitor dielectric layer 75 (block 1170). The plate electrode 80 may include a metal or a metal compound. The plate electrode 80 may be formed to include a part to fill an empty space between the storage electrodes 50.

The storage electrodes 50, the capacitor dielectric layer 75, and the plate electrode 80 may configure a capacitor 90. The storage electrodes 50 may be interpreted as lower electrodes of the capacitor 90, and the plate electrode 80 may be interpreted as an upper electrode of the capacitor 90.

FIGS. 4A to 4H are cross-sectional views showing an area taken along line I-I' of FIG. 1 for describing methods of fabricating a semiconductor device in accordance with some embodiments of the inventive concept.

Figure 4A:
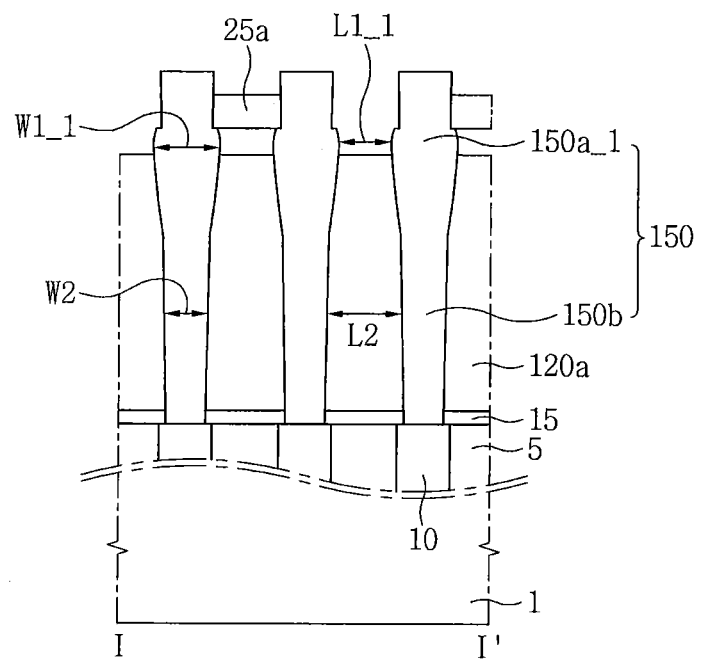
FIGS. 4A to 4H are cross-sectional views showing other methods of fabricating a semiconductor device in accordance with some embodiments of the inventive concept.

Referring to FIGS. 1, 3D, and 4A, a substrate formed using substantially the same method as that described in FIGS. 3A to 3D, may be prepared. For example, as described in FIG. 3A, an interlayer insulating layer 20 and conductive patterns 10 passing through the interlayer insulating layer 20 may be formed on a semiconductor substrate 1 having a switching device, and a stopping insulating layer 15, a molding layer 20, a supporter layer 25, and a buffer layer 30 may be sequentially formed on the interlayer insulating layer 20. Next, as described in FIG. 3B, holes sequentially passing through the buffer layer 30, the supporter layer 25, the molding layer 20, and the stopping insulating layer 15 may be formed. Next, as described in FIG. 3C, storage electrodes 150 filling the holes may be formed. Next, as described in FIG. 3D, a supporter pattern 25*a* having an opening may be formed by patterning the supporter layer 25.

Each of the storage electrodes 150 may include a first part 150*a*_1 and a second part 150*b* disposed under the first part 150*a*_1. The first and second parts 150*a*_1 and 150*b* of the storage electrodes 150 may be located under the supporter pattern 25*a*. In the storage electrodes 150, the first part 150*a*_1 may be closer to the supporter pattern 25*a* than the second part 150*b*.

Each of the first parts 150*a*_1 of the storage electrodes 150 may have a first width W1_1. The first parts 150*a*_1 of the storage electrodes 150 may be spaced apart from each other by the first distance L1_1. The storage electrodes 150 may have the maximum width at the first parts 150*a*_1. The maximum width of the storage electrodes 150 may be the first width W1_1.

The first width W1_1 of the first parts 150*a*1 of the storage electrodes 150 may be greater than a width W2 of the second parts 150*b* of the storage electrodes 150. The first distance L1_1 between the first parts 150*a*_1 of the storage electrodes 150 may be smaller than a distance L2 between the second parts 150*b* of the storage electrodes 150.

The molding layer (reference numeral 20 in FIG. 3D) may be firstly partially-etched to increase exposed parts of the storage electrodes 150. The buffer layer (reference numeral 30 in FIG. 3D) may be removed while the molding layer (reference numeral 20 in FIG. 3D) is firstly partially-etched. Parts of the first parts 150*a*_1 of the storage electrodes 150 and a lower surface of the supporter pattern 55 may be exposed while the firstly partially-etched molding layer 120a is formed. Parts having the maximum width W1_1 of the first parts 150a_1 of the storage electrodes 150 may be exposed while the firstly partially-etched molding layer 120a is formed.

Figure 4B:
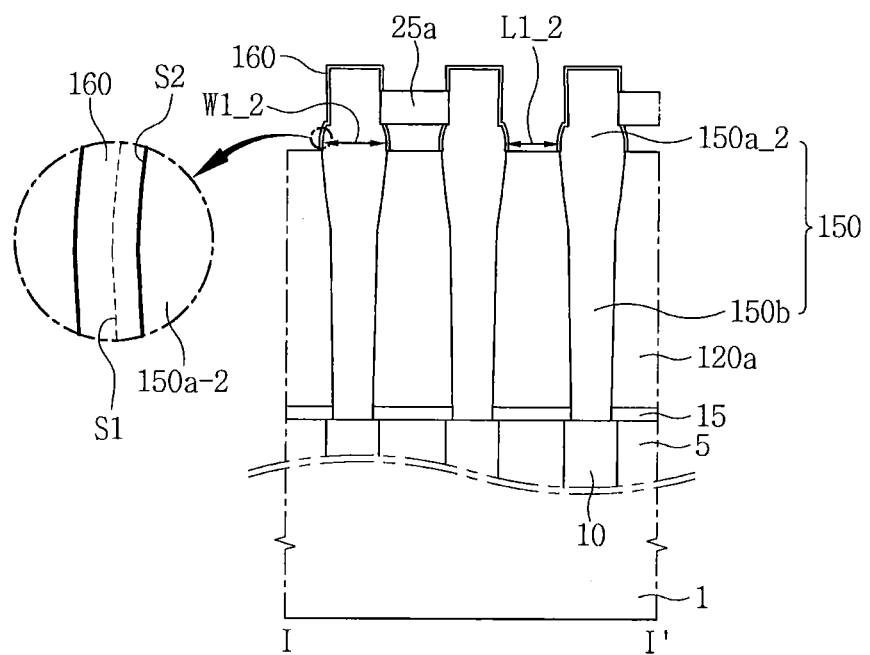

Referring to FIGS. 1 and 4B, a first sacrificial oxide layer 160 may be formed on the exposed parts of the storage electrodes 150. The first sacrificial oxide layer 160 may be formed by oxidizing the exposed parts of the storage electrodes 150. The first sacrificial oxide layer 160 may be an oxide of a conductive material configuring the storage electrodes 150. When the storage electrodes 150 are formed of a TiN material, the first sacrificial oxide layer 160 may be formed of an oxide of the TiN material, for example, TiON.

In some embodiments, the formation of the first sacrificial oxide layer 160 may include a process of oxidizing the exposed parts of the storage electrodes 150 under a process gas atmosphere including oxygen or ozone at a higher temperature than room temperature.

In other embodiments, the formation of the first sacrificial oxide layer 160 may include naturally oxidizing the exposed parts of the storage electrodes 150 by exposing the exposed parts of the storage electrodes 150 to air including oxygen.

In FIG. 4B, the reference numeral "S1" may refer to side surfaces of the first parts 150a_1 of the storage electrodes 150 before the first sacrificial oxide layer 160 is formed, and the reference numeral "S2" may refer to side surfaces of first parts 150a_2 of the storage electrodes 150 after the first sacrificial oxide layer 160 is formed.

While the first sacrificial oxide layer 160 is formed, widths of the exposed parts of the storage electrodes 150 may decrease. While the first sacrificial oxide layer 160 is formed, the storage electrodes 150 may be formed to have the first part 150a_2 having a second width W1_2 smaller than the first width W1_1, instead of the first part (reference numeral 150a_1 in FIG. 4A) having the first width W1_1. Accordingly, while the first sacrificial oxide layer 160 is formed, the maximum width of the storage electrodes 150 may decrease, and the distance between the storage electrodes 150 may increase.

The second width W1_2 of the first parts 150a_2 of the storage electrodes 150 after the first sacrificial oxide layer 160 is formed, may be smaller than the first width W1_1 of the first parts 150a_1 of the storage electrodes 150 before the first sacrificial oxide layer 160 is formed.

A distance L1_2 between the first parts 150a_2 of the storage electrodes 150 after the first sacrificial oxide layer 160 is formed, may be greater than the first distance L1_1 of the first parts 150a_1 of the storage electrodes 150 before the first sacrificial oxide layer 160 is formed.

Figure 4C:
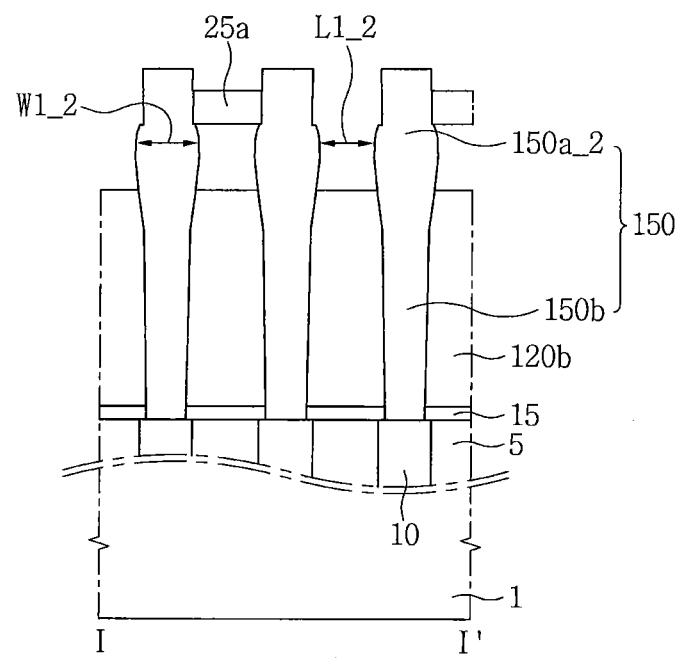

Referring to FIGS. 1 and 4C, the firstly partially-etched molding layer 120a may be secondly partially etched. The first sacrificial oxide layer 160 may be removed while the firstly partially-etched molding layer 120a is secondly partially etched. The first sacrificial oxide layer 160 may be etched and removed by the process of secondly partially-etching the firstly partially-etched molding layer 120a. The exposed parts of the storage electrodes 150 may increase while forming the secondly partially-etched molding layer 120b and removing the first sacrificial oxide layer 160. The exposed parts of the first parts 150a_2 of the storage electrodes 150 may increase while forming the secondly partially-etched molding layer 120b and removing the first sacrificial oxide layer 160.

Figure 4D:
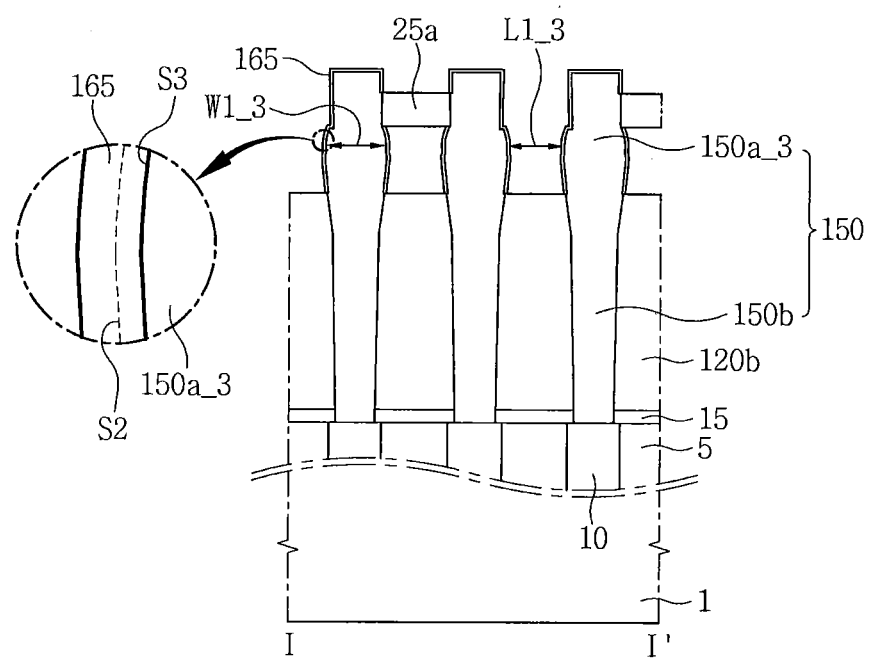

Referring to FIGS. 1 and 4D, after forming the secondly partially-etched molding layer 120b, a second sacrificial oxide layer 165 may be formed on the exposed parts of the storage electrodes 150. The second sacrificial oxide layer 165 may be formed by oxidizing the exposed parts of the storage electrodes 150. The second sacrificial oxide layer 165 may be an oxide (e.g., TiON) of the conductive material configuring the storage electrodes 150.

In FIG. 4D, the reference numeral "S2" may refer to side surfaces of the first parts 150a_2 of the storage electrodes 150 before the second sacrificial oxide layer 165 is formed, and the reference numeral "S3" may refer to side surfaces of first parts 150a 3 of the storage electrodes 150 after the second sacrificial oxide layer 165 is formed.

While the second sacrificial oxide layer 165 is formed, widths of the exposed parts of the storage electrodes 150 may decrease. While the second sacrificial oxide layer 165 is formed, the storage electrodes 150 may be formed to have the first part 150a_3 having a third width W1_3 smaller than the second width W1_2, instead of the first part (reference numeral 150a_2 in FIG. 4C) having the second width W1_2. While the second sacrificial oxide layer 165 is formed, the maximum width of the storage electrodes 150 may decrease, and the distance between the storage electrodes 150 may increase.

The third width W1_3 of the first parts (reference numeral 150a_3 in FIG. 4D) of the storage electrodes 150 after the second sacrificial oxide layer 165 is formed, may be smaller than the second width W1_2 of the first parts (reference numeral 150a_2 in FIG. 4C) of the storage electrodes 150 before the second sacrificial oxide layer 165 is formed. A distance L1_3 between the first parts (reference numeral 150a_3 in FIG. 4D) of the storage electrodes 150 after the second sacrificial oxide layer 165 is formed, may be greater than the distance L1_2 of the first parts (reference numeral 150a_2 in FIG. 4C) of the storage electrodes 150 before the second sacrificial oxide layer 165 is formed.

Figure 4E:
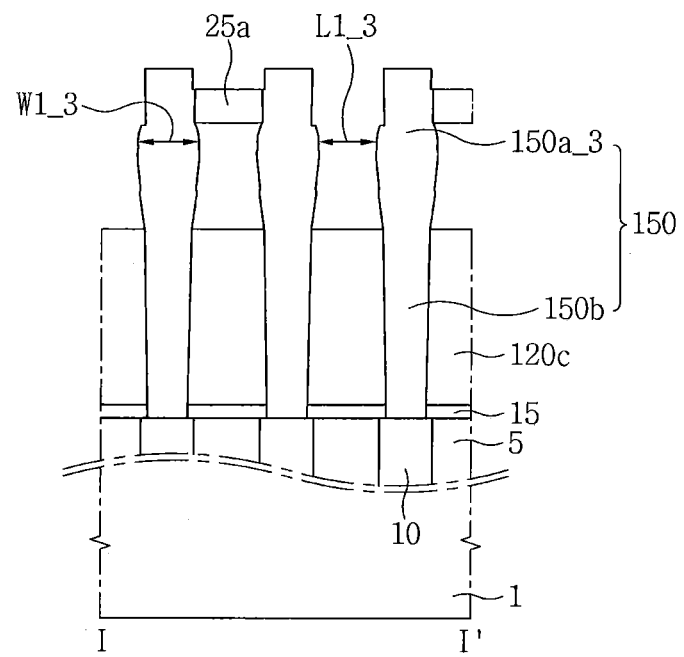

Referring to FIGS. 1 and 4E, the secondly partially-etched molding layer 120b may be thirdly partially etched. While the secondly partially-etched molding layer 120b is thirdly partially etched, the second sacrificial oxide layer 165 may be removed. The second sacrificial oxide layer 165 may be etched and removed by a process of thirdly partially etching the secondly partially-etched molding layer 120b. While forming the thirdly partially-etched molding layer 120c and removing the second sacrificial oxide layer 165, the exposed parts of the storage electrodes 150 may increase. While forming the thirdly partially-etched molding layer 120c and removing the second sacrificial oxide layer 165, the exposed parts of the first parts 150a 3 of the storage electrodes 150 may increase.

Figure 4F:
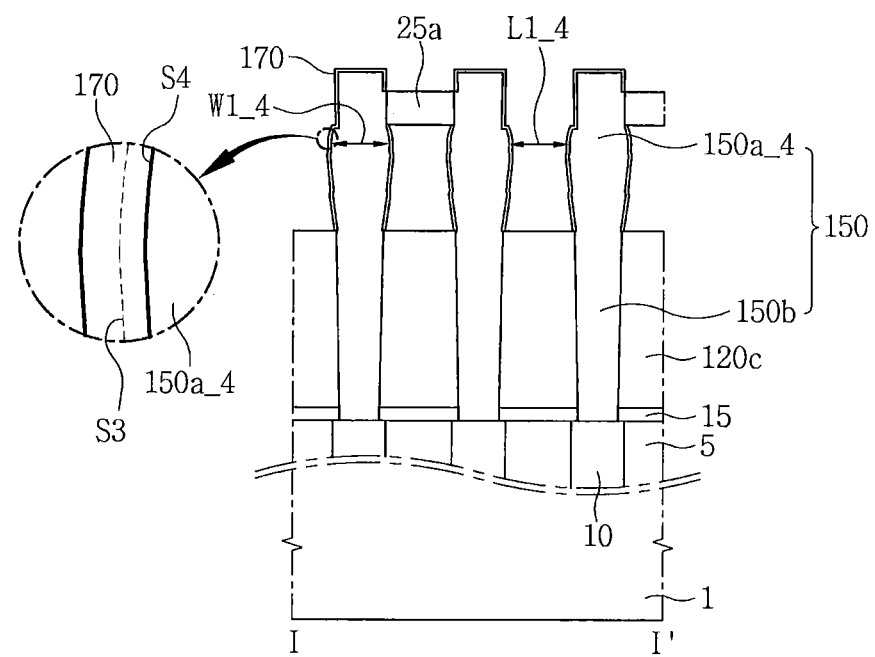

Referring to FIGS. 1 and 4F, a third sacrificial oxide layer 170 may be formed on the exposed parts of the storage electrodes 150. The third sacrificial oxide layer 170 may be formed by oxidizing the exposed parts of the storage electrodes 150. The third sacrificial oxide layer 170 may be an oxide of the conductive material of the storage electrodes 150.

In FIG. 4F, the reference numeral "S3" may refer to side surfaces of the first parts 150a 3 of the storage electrodes 150 before the third sacrificial oxide layer 170 is formed, and the reference numeral "S4" may refer to side surfaces of first parts 150a_4 of the storage electrodes 150 after the third sacrificial oxide layer 170 is formed.

While the third sacrificial oxide layer 170 is formed, widths of the exposed parts of the storage electrodes 150 may decrease. While the third sacrificial oxide layer 170 is formed, the storage electrodes 150 may be formed to include first parts 150a_4 having a fourth width W1_4 smaller than the third width W1_3, instead of the first parts (reference numeral 150a 3 in FIG. 4E) having the third width W1_3.

While the third sacrificial oxide layer 170 is formed, the maximum width of the storage electrodes 150 may decrease, and the distance between the storage electrodes 150 may increase.

The fourth width W1_4 of the first parts 150a_4 of the storage electrodes 150 after the third sacrificial oxide layer 170 is formed, may be smaller than the third width W1_3 of the first parts 150a_3 of the storage electrodes 150 before the third sacrificial oxide layer 170 is formed. A distance L1_4 between the first parts 150a_4 of the storage electrodes 150 after third sacrificial oxide layer 170 is formed, may be greater than the distance L1_3 of the first parts 150a_3 of the storage electrodes 150 before the third sacrificial oxide layer 170 is formed.

Figure 4G:
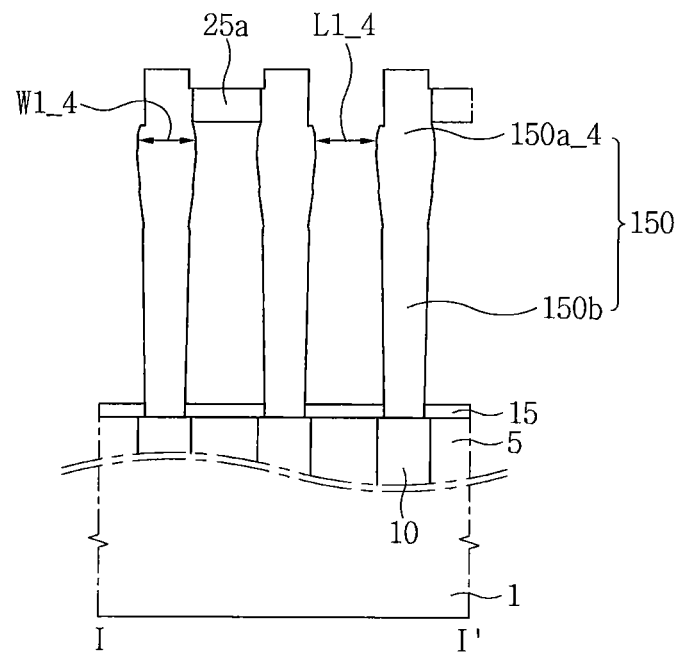

Referring to FIGS. 1 and 4G, the thirdly partially-etched molding layer 120C and the third sacrificial oxide layer 170 may be etched and removed. The supporter pattern 55, the stopping insulating layer 15, and the storage electrodes 150 may remain while removing the thirdly partially-etched molding layer 120C and the third sacrificial oxide layer 170.

The fourth width W1_4 of the first parts 150a_4 of the storage electrodes 150 after forming the third sacrificial oxide layer 170 or removing the third sacrificial oxide layer 170, may be smaller than the first width (reference numeral W1_1 in FIG. 4A) of the first parts (reference numeral 150a_1 in FIG. 4A) of the storage electrodes 150 before forming the first sacrificial oxide layer 160.

The distance L1_4 of the first parts 150a_4 of the storage electrodes 150 after forming the third sacrificial oxide layer 170 or removing the third sacrificial oxide layer 170, may be greater than the first distance (reference numeral L1_1 in FIG. 4A) of the first parts (reference numeral 150a_1 in FIG. 4A) of the storage electrodes 150 before forming the first sacrificial oxide layer 160.

An oxidation process of forming a sacrificial oxide layer may be performed after each partial-etch process while partially-etching the molding layer (reference numeral 20 in FIG. 3D) throughout several steps as shown in FIGS. 4A to 4G. As a result, the maximum width of the storage electrodes 150 may gradually decrease by performing a process of dividedly etching the molding layer (reference numeral 20 in FIG. 3D), and a process of forming a sacrificial oxide layer on the exposed parts of the storage electrodes 150 at every divided-etch process stage. The minimum distance between the storage electrodes 150 may gradually increase due to the divided-etch process and the oxidation process. Therefore, bending deformation of the storage electrodes 150 may be prevented, since the minimum distance between the storage electrodes 150 gradually increases by repeatedly performing the divided-etch process and the oxidation process.

In some embodiments, while performing a process of forming and removing the first sacrificial oxide layer (reference numeral 160 in FIG. 4B), the second sacrificial oxide layer (reference numeral 165 in FIG. 4D), and the third sacrificial oxide layer (reference numeral 170 in FIG. 4F), the storage electrodes 150 may be formed to include the first part 150a_4 having the fourth width W1_4 smaller than the first width W1_1, instead of the first part (reference numeral 150a_1 in FIG. 4A) having the first width W1_1. Although the processes of forming the first sacrificial oxide layer (reference numeral 160 in FIG. 4B), the second sacrificial oxide layer (reference numeral 165 in FIG. 4D), and the third sacrificial oxide layer (reference numeral 170 in FIG. 4F) using the three sacrificial oxidation processes and removing those first to third sacrificial oxide layers 160, 165, and 170 are described in the above embodiments, the number of operations of the oxidation processes of the inventive concept may not be limited thereto. For example, in the inventive concept, the number of the divided-etch process and oxidation process may increase or decrease according to the first distance L1_1 between the first parts (reference numeral 150a_1 in FIG. 4A) of the storage electrodes 150. For example, it is possible to increase the number of process steps of dividedly etching the molding layer (reference numeral 20 in FIG. 3D), and perform an oxidation process in which a sacrificial oxide layer is formed on the exposed parts of the storage electrodes 150 at every divided-etch process. Likewise, the first distance L1_1 between the first parts (reference numeral 150a_1 in FIG. 4A) of the storage electrodes 150 may gradually increase by increasing the number of process steps of dividedly etching the molding layer (reference numeral 20 in FIG. 3D), and increasing the processes of oxidizing the exposed parts of the storage electrodes 150. Accordingly, it is possible to prevent bending deformation of the storage electrodes 150 caused by the first parts (reference numeral 150a_1 in FIG. 4A) of the storage electrodes 150 being attracted to each other.

Figure 4H:
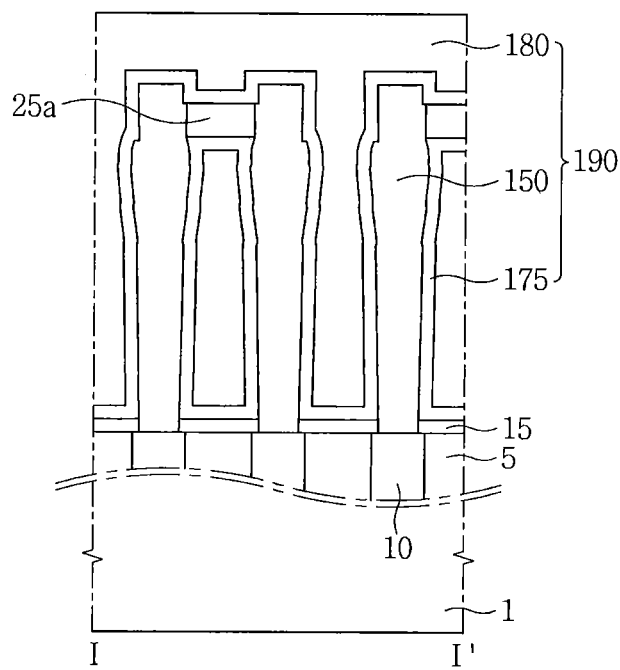

Referring to FIGS. 1 and 4H, a capacitor dielectric layer 175 may be conformally formed on the substrate having the storage electrodes 150, after removing the third sacrificial oxide layer 170 and the thirdly partially-etched molding layer 120C.

The distance between the storage electrodes 150 increases while the molding layer (reference numeral 20 in FIG. 3D) is dividedly etched, and the first to third sacrificial oxide layers 160, 165, and 170 are formed and removed. Accordingly, bending deformation of the storage electrodes 150 occurring while removing the molding layer (reference numeral 20 in FIG. 3D) by an etch process and/or performing a process of forming a dielectric material for forming the capacitor dielectric layer 175, may be reduced or prevented. Therefore, since the storage electrodes 150 are formed without the bending deformation while increasing the distance between the storage electrodes 150, it is possible to design the distance between the storage electrodes 150 to be narrower, and thereby increase integration of a semiconductor device and fabricate a scaled-down product.

Figure 5:
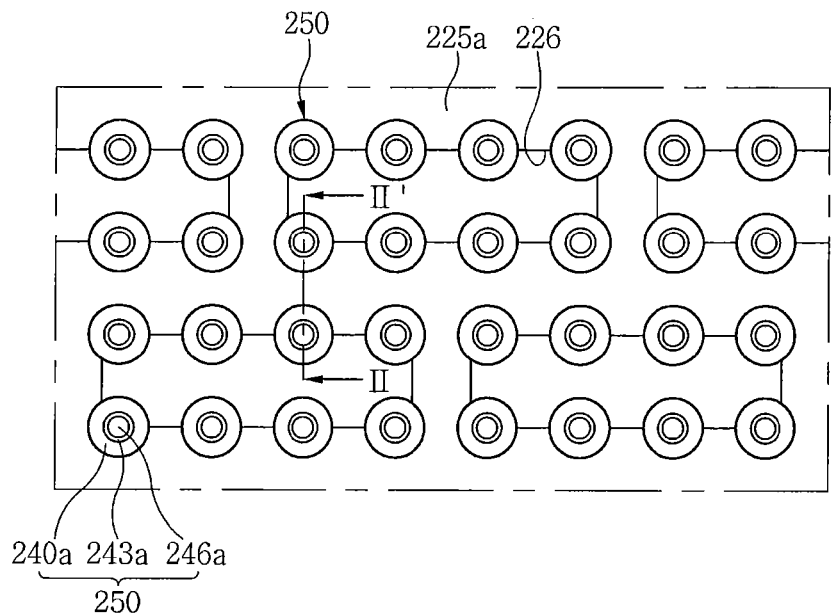
FIG. 5 is a layout showing a semiconductor device in accordance with some embodiments of the inventive concept.
Figure 6:
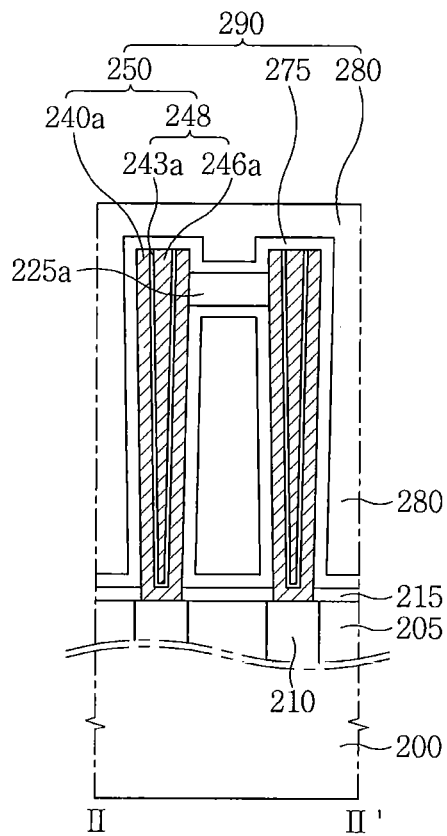
FIG. 6 is a cross-sectional view showing a semiconductor device in accordance with some embodiments of the inventive concept.

FIG. 5 is a layout showing a semiconductor device in accordance with some other embodiments of the inventive concept, and FIG. 6 is a cross-sectional view showing an area taken along line II-II' of FIG. 5, for describing the semiconductor device in accordance with the other embodiment of the inventive concept. FIGS. 7A to 7F are cross-sectional views showing the area taken along line II-II' of FIG. 5, for describing methods of fabricating the semiconductor device in accordance with the other embodiments of the inventive concept.

First, the semiconductor device in accordance with the other embodiments of the inventive concept will be described with reference to FIGS. 5 and 6.

Referring to FIGS. 5 and 6, a semiconductor substrate 200 having a switching device may be provided. An interlayer insulating layer 205 may be arranged on the semiconductor substrate 200. Conductive patterns 210 passing through the interlayer insulating layer 205 may be arranged. A stopping insulating layer 215 may be arranged on the interlayer insulating layer 205. Storage electrode structures 250 electrically connected to the conductive patterns 210 may be arranged on the interlayer insulating layer 205. Lower side surfaces of the storage electrode structures 250 may be surrounded by the stopping insulating layer 215.

Each of the storage electrode structures 250 may include a storage conductive pattern 240a and a core buried structure 248.

The storage conductive pattern 240a may include a recessed part of which a top is open, and the core buried structure 248 may fill the recessed part of the storage conductive pattern 240a. The storage conductive pattern 240a may surround side and bottom surfaces of the core buried structure 248. The core buried structure 248 may function to prevent bending deformation of the storage electrode structures 250.

The core buried structure 248 may include a core oxide pattern 243a and a core buried pattern 246a. The core buried pattern 246a may be a pillar shape, and the storage conductive pattern 240a may be formed to surround side and bottom surfaces of the core buried pattern 246a. The core oxide pattern 243a may be interposed between the core buried pattern 246a and the storage conductive pattern 240a.

The storage conductive pattern 240a may be formed of a conductive material such as a metal or a metal nitride. The core oxide pattern 243a may be formed to have conductive characteristics. The core oxide pattern 243a may be an oxide formed by oxidizing the conductive material configuring the storage conductive pattern 240a. For example, when the storage conductive pattern 240a is formed of titanium nitride, the core oxide pattern 243a may be formed of a material formed by oxidizing the titanium nitride, for example, TiON. The core buried pattern 246a may be formed of a metal, a metal nitride, or a metal oxide.

In some embodiments, the core buried pattern 246a may be formed of the same material as the storage conductive pattern 240a. For example, the core buried pattern 246a and the storage conductive pattern 240a may be formed of titanium nitride.

In other embodiments, the core buried pattern 246a may be formed of a different material from the storage conductive pattern 240a. The core buried pattern 246a may be formed of a material having a greater hardness than the storage conductive pattern 240a. For example, when the storage conductive pattern 240a is formed of titanium nitride, the core buried pattern 246a may be formed of tungsten or a tungsten compound.

A supporter pattern 225a connecting the storage electrode structures 250 may be arranged. The supporter pattern 225a may be formed of an insulating material such as silicon nitride. The supporter pattern 225a may connect side surfaces of upper parts of the storage electrode structures 250.

A capacitor dielectric layer 275 conformally covering the substrate having the storage electrode structures 250 and supporter pattern 225a may be arranged. The capacitor dielectric layer 275 may be formed of a different material from the core oxide pattern 243a. The capacitor dielectric layer 275 may include a TaO layer, a TaON layer, an AlO layer, a HfO layer, a ZrO layer, a TiO layer, a BST((Ba,Sr)TiO) layer, a STO(SrTiO) layer, a BTO(BaTiO) layer, a PZT(Pb(Zr,Ti)O) layer, a (Pb,La)(Zr,Ti)O layer, a Ba(Zr,Ti)O layer, a Sr(Zr,Ti)O layer, and/or a combination thereof.

A plate electrode 280 may be arranged on the capacitor dielectric layer 275. The storage electrode structures 250, the capacitor dielectric layer 275, and the plate electrode 280 may configure a capacitor 290.

Next, a method of fabricating the semiconductor device in accordance with the other embodiment of the inventive concept will be described with reference to FIGS. 7A to 7F.

Figure 7A:
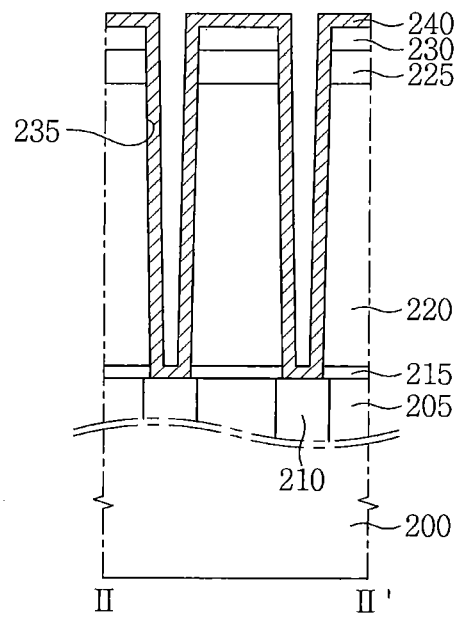
FIGS. 7A to 7F are cross-sectional views showing methods of fabricating a semiconductor device in accordance with some embodiments of the inventive concept.

Referring to FIGS. 5 and 7A, an interlayer insulating layer 205 may be formed on a semiconductor substrate 200 having a switching device. Conductive patterns 210 passing through the interlayer insulating layer 205 may be formed. A stopping insulating layer 215 covering the conductive patterns 210 may be formed on the interlayer insulating layer 205. A molding layer 220, a supporter layer 225, and a buffer layer 230 may be sequentially formed on the stopping insulating layer 215. Holes 235 sequentially passing through the buffer layer 230, the supporter layer 225, the molding layer 220, and the stopping insulating layer 215 and exposing the conductive patterns 210 may be formed.

A storage conductive layer 240 may be formed on the substrate having the holes 235. The storage conductive layer 240 may be conformally formed on the substrate having the holes 235. The storage conductive layer 240 may be formed to cover sidewalls and bottom surfaces of the holes 235 and to open center parts of the holes 235. The storage conductive layer 240 may be formed of a conductive material such as a metal or a metal nitride.

Figure 7B:
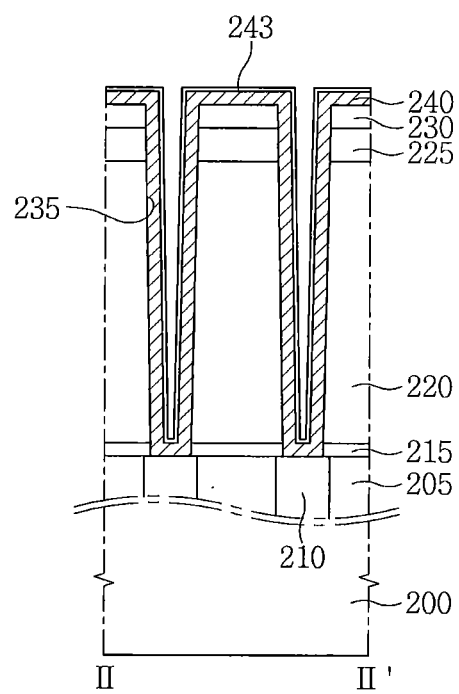

Referring to FIGS. 5 and 7B, a core oxide layer 243 may be formed on the storage conductive layer 240. The core oxide layer 243 may be formed by oxidizing the storage conductive layer 240. The core oxide layer 243 may be formed to have conductive characteristics. Since the core oxide layer 243 is formed to have lots of trap sites due to oxygen defects, the core oxide layer 243 may have conductive characteristics. The core oxide layer 243 may be formed of an oxide (e.g., TiON) of the conductive material (e.g., TiN) configuring the storage conductive layer 240.

In some embodiments, the formation of the core oxide layer 243 may include naturally oxidizing the storage conductive layer 240 by exposing the storage conductive layer 240 to air including oxygen.

In other embodiments, the formation of the core oxide layer 243 may include oxidizing the storage conductive layer 240 using an oxidation process performed under an oxygen or ozone atmosphere at a higher temperature than room temperature.

Figure 7C:
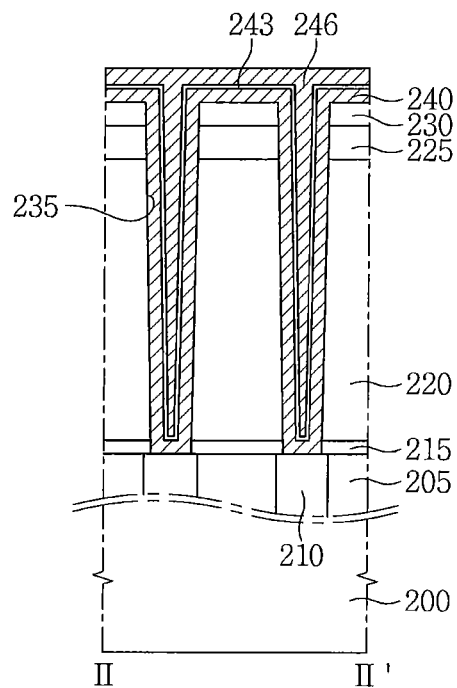

Referring to FIGS. 5 and 7C, a core buried layer 246 may be formed on the substrate having the core oxide layer 243. The holes 235 may be filled while the core buried layer 246 is formed on the core oxide layer 243.

In some embodiments, the core buried layer 246 may be formed of the same material as the storage conductive layer 240. For example, the core buried layer 246 and the storage conductive layer 240 may be formed of titanium nitride.

In other embodiments, the core buried layer 246 may be formed of a different material from the storage conductive layer 240. The core buried layer 246 may be formed of a material having a greater hardness than the storage conductive layer 240. For example, when the storage conductive layer 240 is formed of titanium nitride, the core buried layer 246 may be formed of tungsten or a tungsten compound.

Figure 7D:
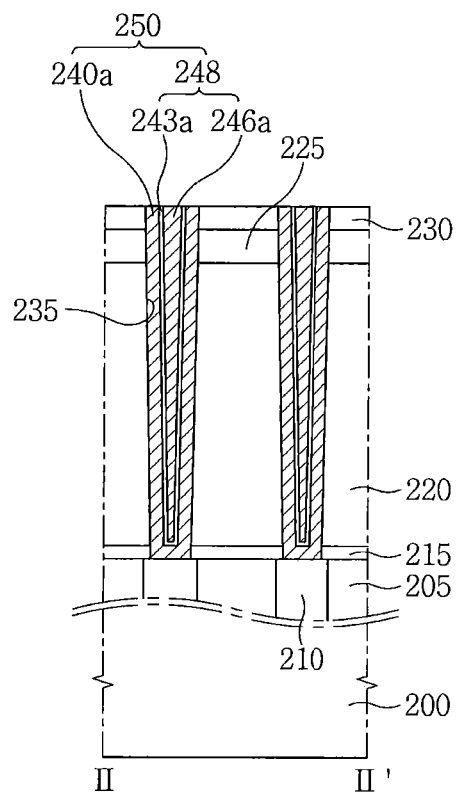

Referring to FIGS. 5 and 7D, storage electrode structures 250 may be formed by planarizing the core buried layer 246, the core oxide layer 243, and the storage conductive layer 240, until the buffer layer 230 is exposed. The planarization may be performed using a chemical-mechanical planarization process or an etchback process.

Each of the storage electrode structures 250 may include a storage conductive pattern 240a and a core buried structure 248. The core buried structure 248 may include a core oxide pattern 243a and a core buried pattern 246a.

The core buried pattern 246a may be formed by planarizing the core buried layer 246. The core oxide pattern 243a may be formed by planarizing the core oxide layer 243. The storage conductive pattern 240a may be formed by planarizing the storage conductive layer 240.

In each of the holes 235, the storage conductive pattern 240a may be formed to surround the core buried pattern 246a, and the core oxide pattern 243a may be interposed between the storage conductive pattern 240a and the core buried pattern 246a.

Figure 7E:
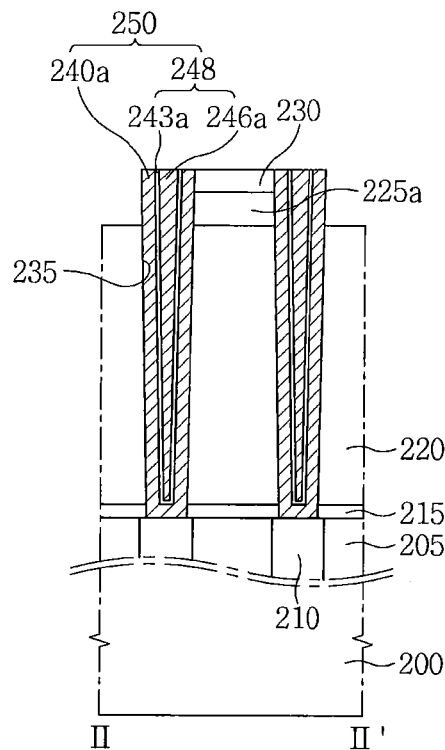

Referring to FIGS. 5 and 7E, a supporter pattern 225a having an opening 226 may be formed by patterning the supporter layer 225. While patterning the supporter layer 225, the buffer layer 230 may also be patterned.

Figure 7F:
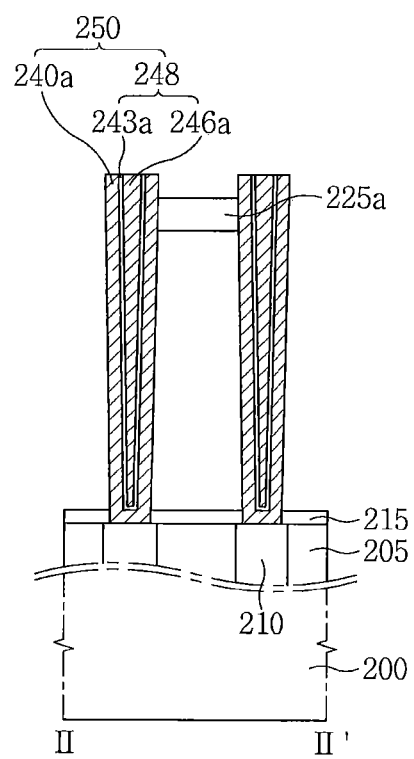

Referring to FIGS. 5 and 7F, the buffer layer 230 and the molding layer 220 may be removed by an etch process. As a result, exposed parts of the storage electrode structures 250 may be more increased.

Referring again to FIG. 6, a capacitor dielectric layer 275 may be formed on the substrate having the storage electrode structures 250. A plate electrode 280 may be formed on the capacitor dielectric layer 275.

While removing the buffer layer 230 and the molding layer 220 using an etch process and/or performing an oxide formation process for forming the capacitor dielectric layer 275, the core buried structure 248 may function to prevent or reduce bending deformation of the storage electrode structures 250. Accordingly, since the storage electrode structures 250 may be formed without the bending deformation, it is possible to design the distance between the storage electrode structures 250 to be narrower, and thereby increase integration of a semiconductor device and fabricate a scaled-down product.

Figure 8:
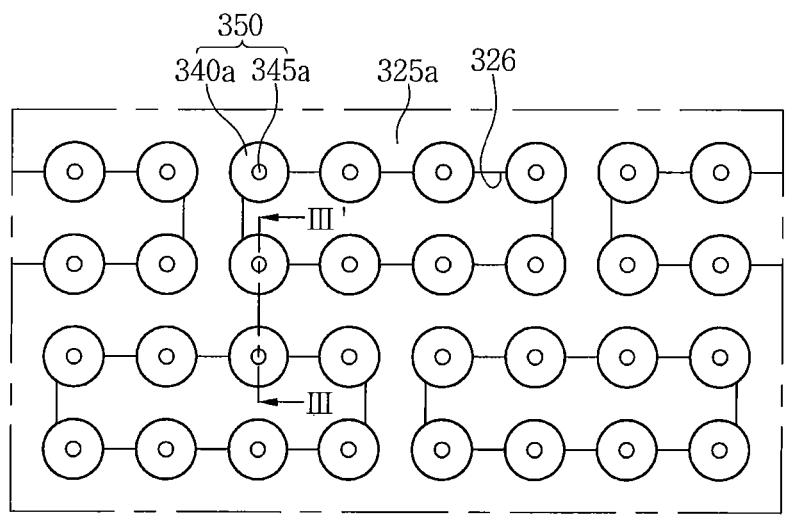
FIG. 8 is a layout showing a semiconductor device in accordance with some embodiments of the inventive concept.
Figure 9:
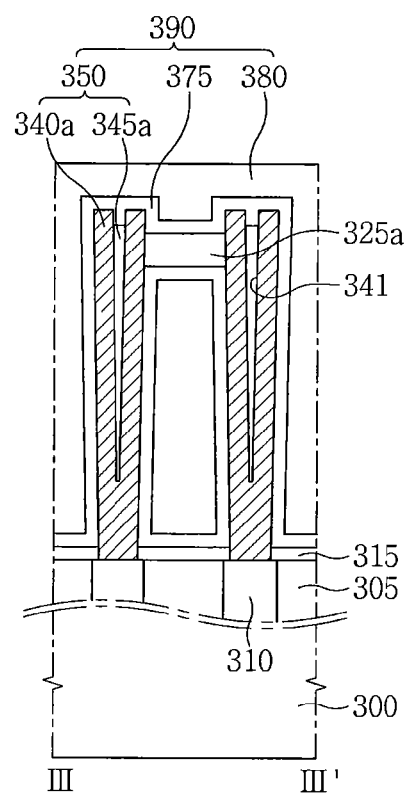
FIG. 9 is a cross-sectional view showing a semiconductor device in accordance with some embodiments of the inventive concept.

FIG. 8 is a layout showing a semiconductor device in accordance with some other embodiments of the inventive concept, and FIG. 9 is a cross-sectional view showing an area taken along line of FIG. 8, for describing the semiconductor device in accordance with the other embodiments of the inventive concept. FIGS. 10A to 10F are cross-sectional views showing an area taken along line III-III' of FIG. 8, for describing methods of fabricating the semiconductor device in accordance with the other embodiments of the inventive concept.

The semiconductor device in accordance with the other embodiments of the inventive concept will be described with reference to FIGS. 8 and 9.

Referring to FIGS. 8 and 9, a semiconductor substrate 300 having a switching device may be provided. An interlayer insulating layer 305 may be arranged on the semiconductor substrate 300. Conductive patterns 310 passing through the interlayer insulating layer 305 may be arranged. A stopping insulating layer 315 covering the conductive patterns 310 may be arranged on the interlayer insulating layer 305. Storage electrode structures 350 electrically connected to the conductive patterns 310 may be arranged on the interlayer insulating layer 305. Lower side surfaces of the storage electrode structures 350 may be surrounded by the stopping insulating layer 315. A supporter pattern 325a connecting the storage electrode structures 350 may be arranged. The supporter pattern 325a may be formed of an insulating material such as silicon nitride. The supporter pattern 325a may connect side surfaces of upper parts of the storage electrode structures 350 to each other.

Each of the storage electrode structures 350 may include a storage conductive pattern 340a and a core buried structure 345a. The core buried structure 345a may be a pillar shape, and the storage conductive pattern 340a may surround side and bottom surfaces of the core buried structure 345a. An upper surface of the core buried structure 345a may be located at a lower level than that of the storage conductive pattern 340a. The core buried structure 345a may function to prevent bending deformation of the storage electrode structures 350.

The storage conductive pattern 340a may be formed of a conductive material such as a metal and/or a metal nitride. The core buried structure 345a may be a core oxide pattern. The core buried structure 345a may include an oxide formed by oxidizing the conductive material configuring the storage conductive pattern 340a. For example, when the storage conductive pattern 340a is formed of titanium nitride, the core buried structure 345a may be formed of a material formed by oxidizing the titanium nitride, such as TiON.

A capacitor dielectric layer 375 conformally covering the substrate having the storage electrode structures 350 and the supporter pattern 325a may be arranged. The capacitor dielectric layer 375 may be formed of a different material from the core buried structure 345a. The capacitor dielectric layer 375 may include a TaO layer, a TaON layer, an AlO layer, a HfO layer, a ZrO layer, a TiO layer, a BST((Ba,Sr)TiO) layer, a STO(SrTiO) layer, a BTO(BaTiO) layer, a PZT(Pb(Zr,Ti)O) layer, a (Pb,La)(Zr,Ti)O layer, a Ba(Zr,Ti)O layer, a Sr(Zr,Ti)O layer, and/or a combination thereof.

A plate electrode 380 may be arranged on the capacitor dielectric layer 375. The storage electrode structures 350, the capacitor dielectric layer 375, and the plate electrode 380 may configure a capacitor 390.

Methods of fabricating the semiconductor device in accordance with other embodiments of the inventive concept will be described with reference to FIGS. 8, and 10A to 10F.

Figure 10A:
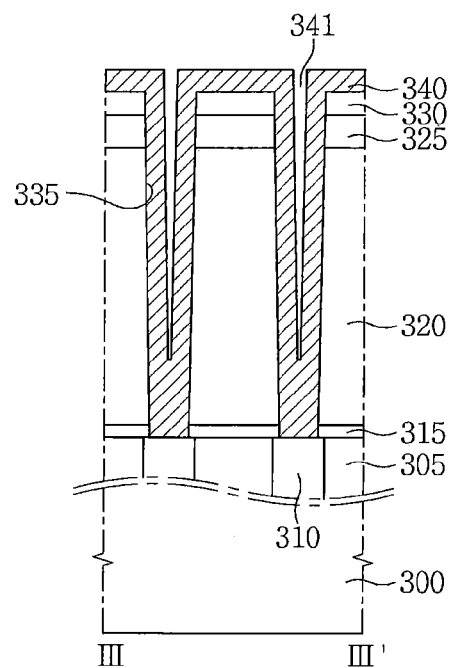
FIGS. 10A to 10E are cross-sectional views showing methods of fabricating a semiconductor device in accordance with some embodiments of the inventive concept.

Referring to FIGS. 8 and 10A, an interlayer insulating layer 305 may be formed on a semiconductor substrate 300 having a switching device. Conductive patterns 310 may be formed on the interlayer insulating layer 305. A stopping insulating layer 315 covering the conductive patterns 310 may be formed on the interlayer insulating layer 305. A molding layer 320, a supporter layer 325, and a buffer layer 330 may be sequentially formed on the stopping insulating layer 315. Holes 335 sequentially passing through the buffer layer 330, the supporter layer 325, the molding layer 320, and the stopping insulating layer 315 and exposing the conductive patterns 310 may be formed.

A storage conductive layer 340 may be formed on the substrate having the holes 335. The storage conductive layer 340 may be conformally formed on the substrate having the holes 335. The storage conductive layer 340 may be formed to cover sidewalls and bottom surfaces of the holes 335 and to open a center part of a top of the holes 335. In the holes 335, the storage conductive layer 340 may have a recessed part 341 of which a top is open. The width of the recessed part 341 may be smaller than a deposition thickness of the storage conductive layer 340.

Figure 10B:
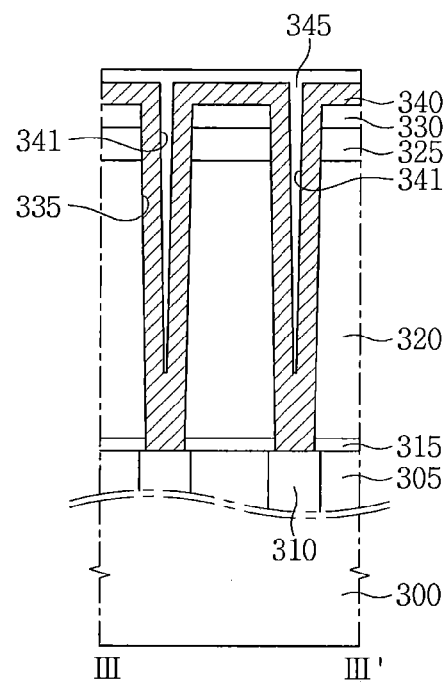

Referring to FIGS. 8 and 10B, a core oxide layer 345 may be formed by oxidizing the storage conductive layer 340. The core oxide layer 345 may be formed to fill the recessed part 341 of the storage conductive layer 340. The core oxide layer 345 may be formed to have conductive characteristics. The formation of the core oxide layer 345 may include oxidizing the storage conductive layer 340 using an oxidation process performed under an oxygen or ozone atmosphere at a higher temperature than room temperature. When the storage conductive layer 340 is formed of a TiN material, the core oxide layer 345 may be formed of an oxide of TiN, for example, TiON.

Figure 10C:
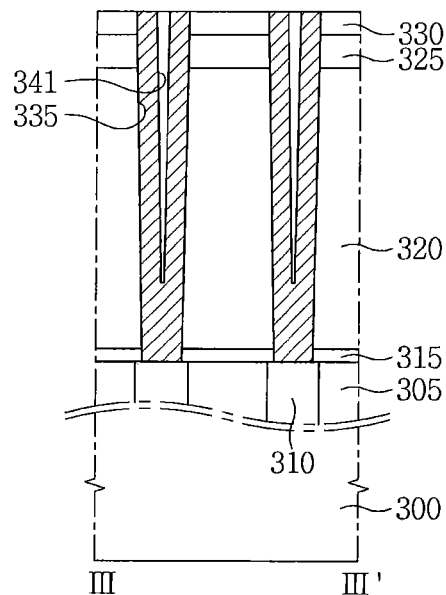

Referring to FIGS. 8 and 10C, storage electrode structures 350 may be formed by planarizing the core oxide layer 345 and the storage conductive layer 340 until the buffer layer 330 is exposed. The planarization may be performed using a chemical-mechanical planarization process or an etchback process.

Each of the storage electrode structures 350 may include a storage conductive pattern 340a and a core oxide pattern 345a. The core oxide pattern 345a may be formed by planarizing the core oxide layer 345, and the storage conductive pattern 340a may be formed by planarizing the storage conductive layer 340. In each of the holes 335, the storage conductive pattern 340a may be formed to surround the core oxide pattern 345a.

Figure 10D:
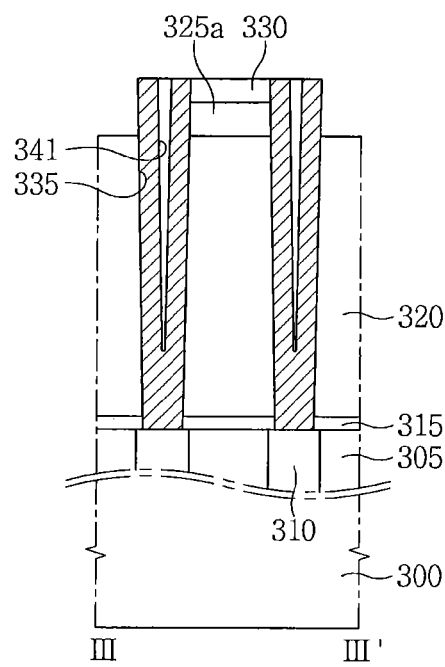

Referring to FIGS. 8 and 10D, a supporter pattern 325a having an opening 326 may be formed by patterning the supporter layer 325. While patterning the supporter layer 325, the buffer layer 330 may also be patterned.

Figure 10E:
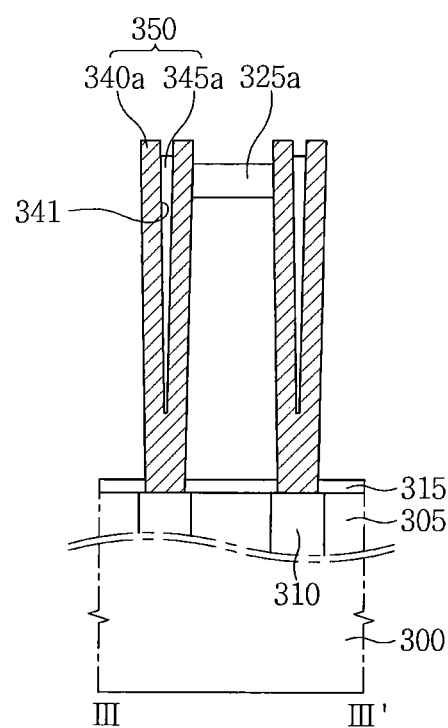

Referring to FIGS. 8 and 10E, the buffer layer 330 and the molding layer 320 may be removed by an etch process. While removing the buffer layer 330 and the molding layer 320, a part of the core oxide pattern 345a may be etched. An upper surface of the core oxide pattern 345a may be located at a lower level than that of the storage conductive pattern 340a.

Referring again to FIGS. 8 and 9, a capacitor dielectric layer 375 may be formed on the substrate having the storage electrode structures 350. A plate electrode 380 may be formed on the capacitor dielectric layer 375.

The core buried structure 345a may prevent or reduce bending deformation of the storage electrode structures 350 occurring while removing the buffer layer 330 and the molding layer 320 by an etch process and/or forming a dielectric material for forming the capacitor dielectric layer 375. Accordingly, since the storage electrode structures 350 may be formed without the bending deformation, it is possible to design the distance between the storage electrode structures 350 to be narrower, and thereby increase integration of a semiconductor device and fabricate a scaled-down product.

Figure 11:
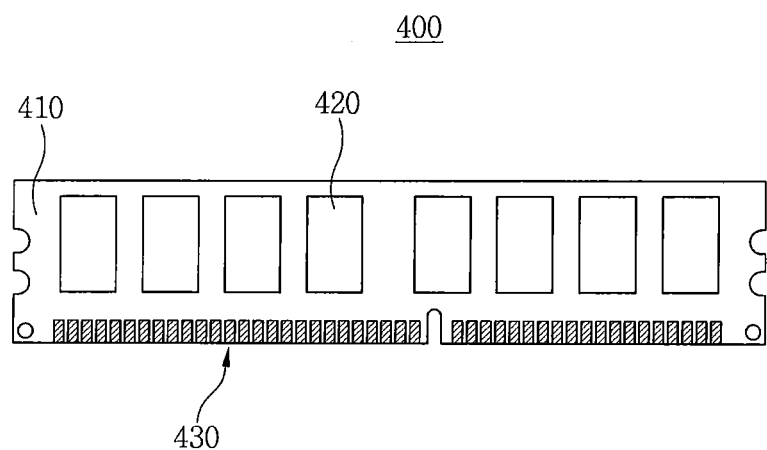
FIG. 11 is a diagram schematically illustrating a memory module including a semiconductor device in accordance with some embodiments of the inventive concept.

FIG. 11 is a diagram schematically illustrating a memory module 400 including a semiconductor device in accordance with some embodiments of the inventive concept.

Referring to FIG. 11, the memory module 400 may include a memory module substrate 410 and a plurality of memory devices 420 and terminals 430 arranged on the memory module substrate 410.

The memory module substrate 410 may include a printed circuit board (PCB) and/or a wafer. The memory devices 420 may be one of the semiconductor devices described with reference to FIGS. 1 to 10E in accordance with some embodiments of the inventive concept, or a semiconductor package including the same. The terminals 430 may include a conductive metal. The terminals 430 may be electrically connected to the memory devices 420.

Figure 12:
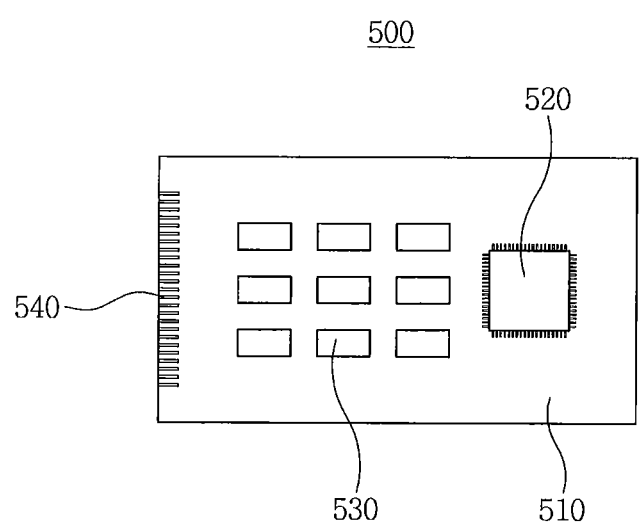
FIG. 12 is a diagram schematically illustrating a semiconductor module including a semiconductor device in accordance with some embodiments of the inventive concept.

FIG. 12 is a diagram schematically illustrating a semiconductor module 500 including a semiconductor device in accordance with some embodiments of the inventive concept.

Referring to FIG. 12, the semiconductor module 500 may include a semiconductor device 530 formed on a module substrate 510. The semiconductor device 530 may be one of the semiconductor devices described with reference to FIGS. 1 to 10E in accordance with some embodiments of the inventive concept, and/or a semiconductor package including the same.

The semiconductor module 500 may further include a microprocessor 520 mounted on the module substrate 510. Input/output terminals 540 may be arranged on at least one side of the module substrate 510.

Figure 13:
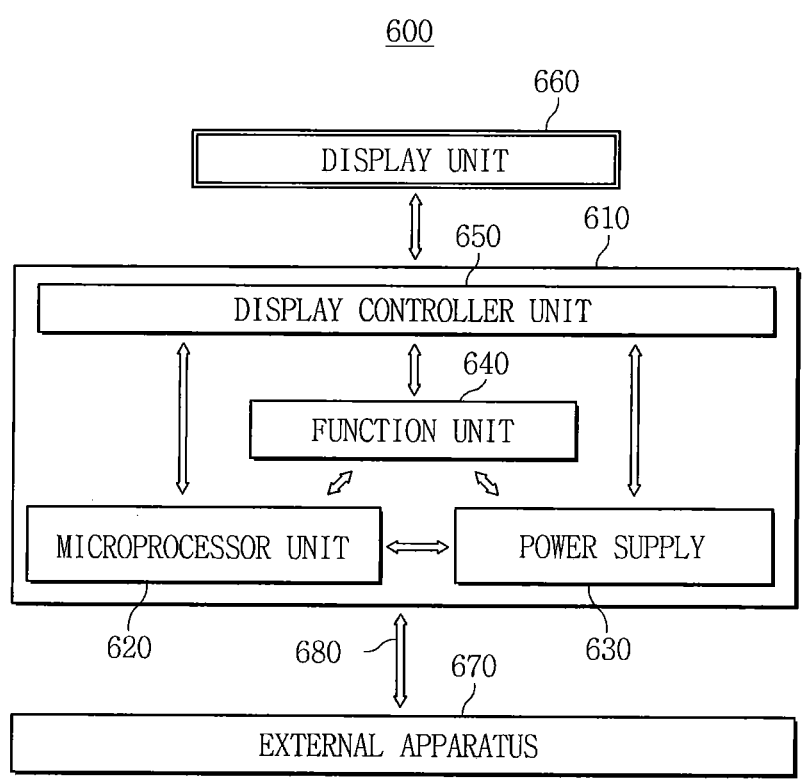
FIG. 13 is a block diagram schematically illustrating an electronic system including a semiconductor device in accordance with some embodiments of the inventive concept.

FIG. 13 is a block diagram schematically illustrating an electronic system 600 including a semiconductor device in accordance with some embodiments of the inventive concept.

Referring to FIG. 13, the electronic system 600 may include a body 610. The body 610 may include a microprocessor unit 620, a power supply 630, a function unit 640, and/or a display controller unit 650. The body 610 may be a system board and/or motherboard including a printed circuit board (PCB).

The microprocessor unit 620, the power supply 630, the function unit 640, and the display controller unit 650 may be mounted and/or installed on the body 610.

A display unit 660 may be arranged on a top surface or outside of the body 610. For example, the display unit 660 may be arranged on a surface of the body 610 and display an image processed by the display controller unit 650.

The power supply 630 may receive a constant voltage from an external power source, etc., divide the voltage into various levels, and supply those voltages to the microprocessor unit 620, the function unit 640, and the display controller unit 650, etc.

The microprocessor unit 620 may receive a voltage from the power supply 630 to control the function unit 640 and the display unit 660.

The function unit 640 may perform various functions of the electronic system 600. For example, if the electronic system 600 is a mobile electronic apparatus such as a mobile phone, the function unit 640 may include several components which can perform functions of wireless communication such as dialing, video output to the display unit 660 through communication with an external apparatus 670, and sound output to a speaker, and if a camera is installed, the function unit 640 may function as an image processor.

In some other embodiments, when the electronic system 600 is connected to a memory card, etc. in order to expand capacity, the function unit 640 may be a memory card controller. The function unit 640 may exchange signals with the external apparatus 670 through a wired or wireless communication unit 680.

In addition, when the electronic system 600 needs a universal serial bus (USB), etc. in order to expand functionality, the function unit 640 may function as an interface controller.

The semiconductor device in accordance with an embodiment of the inventive concept may be included in at least one of the microprocessor unit 620 and the function unit 640.

Figure 14:
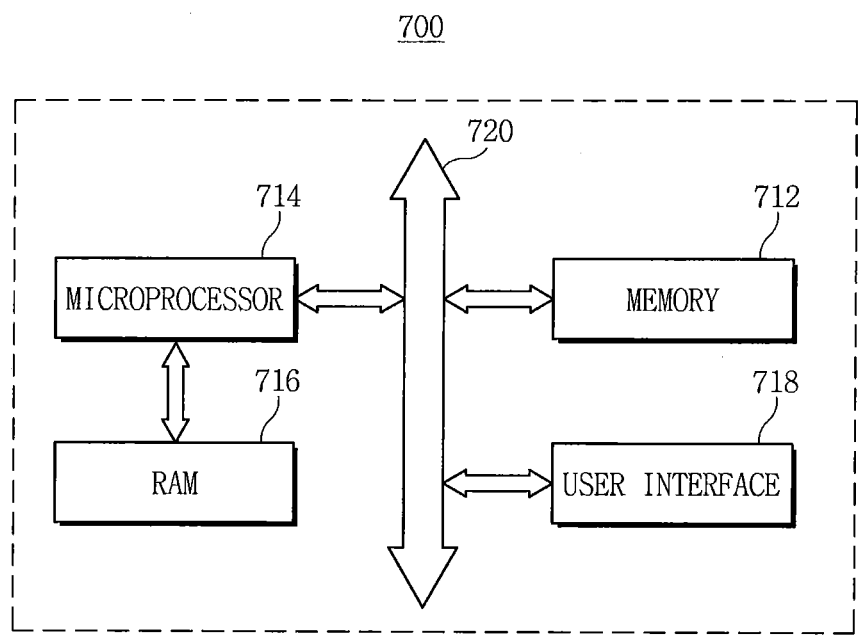
FIG. 14 is a block diagram schematically illustrating another electronic system including a semiconductor device in accordance with some embodiments of the inventive concept.

FIG. 14 is a block diagram schematically illustrating another electronic system 700 including a semiconductor device in accordance with embodiments of the inventive concept.

Referring to FIG. 14, the electronic system 700 may include a semiconductor device in accordance with some embodiments of the inventive concept. The electronic system 700 may be used to fabricate a mobile apparatus and/or a computer. For example, the electronic system 700 may include a memory system 712, a microprocessor 714, a random access memory (RAM) 716, and a user interface 718 performing data communication using a bus 720. The microprocessor 714 may program and control the electronic system 700. The RAM 716 may be used as an operation memory of the microprocessor 714. The microprocessor 714, the RAM 716, and/or other components can be assembled in a single package. The microprocessor 714 and/or the RAM 716 may include a semiconductor package in accordance with various embodiments of the inventive concept.

The user interface 718 may be used to input data to, or output data from the electronic system 700. The memory system 712 may store codes for operating the microprocessor 714, data processed by the microprocessor 714, or external input data. The memory system 712 may include a controller and a memory.

Figure 15:
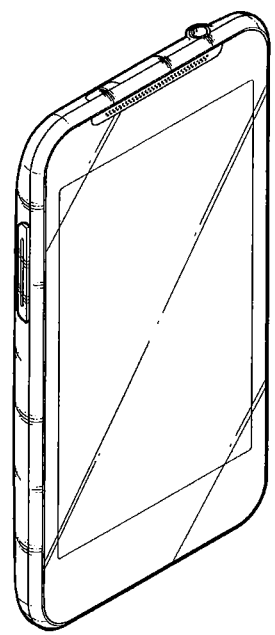
FIG. 15 is a view schematically illustrating a mobile wireless phone including a semiconductor device in accordance with some embodiments of the inventive concept.

FIG. 15 is a view schematically illustrating a mobile wireless phone 800 including a semiconductor device in accordance with some embodiments of the inventive concept. Some embodiments provide that the mobile wireless phone 800 may be understood as a tablet PC. In addition, the semiconductor device in accordance with some embodiments of the inventive concept may be used in a portable computer such as a notebook, an MPEG-1 Audio Layer 3 (MP3) player, an MP4 player, a navigation apparatus, a solid state disk (SSD), a desktop computer, an automobile, or a home appliance, as well as a tablet PC.

In accordance with various embodiments of the inventive concept, methods and structures for preventing deformation of storage electrodes of capacitors may be provided.

In accordance with various embodiments of the inventive concept, defects such as electrical shorts or electrical bridges between storage electrodes due to deformation of the storage electrodes, such as bending, may be reduced or prevented. In addition, the process of fabricating a semiconductor device including a capacitor formation process may be stabilized, since methods and structures for preventing deformation of storage electrodes of capacitors are provided.

In accordance with various embodiments of the inventive concept, since the distance between storage electrodes increases without bending deformation of the storage electrodes, it is possible to design the distance between the storage electrode structures 350 to be narrower, and thereby increase integration of a semiconductor device and fabricate a scaled-down product.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A method of fabricating a semiconductor device, comprising:
   forming a molding layer on a semiconductor substrate;
   forming a first electrode passing through the molding layer;
   partially etching the molding layer to expose a part of the first electrode;
   forming a sacrificial oxide layer by naturally oxidizing the exposed part of the first electrode;
   removing the partially-etched molding layer and the sacrificial oxide layer;
   forming a dielectric layer on the substrate of which the molding layer and the sacrificial oxide layer are removed; and
   forming a second electrode on the dielectric layer.

2. The method of claim 1, wherein forming the sacrificial oxide layer comprises exposing the exposed part of the first electrode to air.

3. The method of claim 1, wherein the first electrode includes a first part having a first width and a second part having a second width that is smaller than the first width, and wherein the first part is located distal to the substrate and the second part is located proximal to the substrate.

4. The method of claim 3, wherein the exposed part of the first electrode is the first part of the first electrode, and wherein forming the sacrificial oxide layer comprises forming the sacrificial oxide layer on the first part of the first electrode.

5. The method of claim 4, wherein the first electrode includes a metal nitride, and the sacrificial oxide layer includes an oxide of the metal nitride.

6. The method of claim 1, wherein removing the partially-etched molding layer and the sacrificial oxide layer comprises removing the sacrificial oxide layer and the molding layer using an oxide-etch process.

7. The method of claim 1, further comprising:
   forming a supporter layer on the molding layer before forming the first electrode, wherein the first electrode is formed to vertically pass through the supporter layer.

8. The method of claim 7, before partially etching the molding layer, the method further comprising forming a supporter pattern connected to a side surface of the first electrode by patterning the supporter layer.

9. The method of claim 1, further comprising:
   forming a stopping insulating layer on the semiconductor substrate before forming the molding layer,
   wherein the first electrode is formed to vertically pass through the stopping insulating layer and
   wherein removing the partially-etched molding layer and the sacrificial oxide layer comprises exposing the stopping insulating layer.

10. The method of claim 3, wherein the first width of the first part of the first electrode decreases while forming the first sacrificial oxide layer.

11. A method of fabricating a semiconductor device, comprising:
    forming a stopping insulating layer on a semiconductor substrate;
    forming a molding layer on the stopping insulating layer;
    forming a supporter layer on the molding layer;
    forming storage electrodes passing through the supporter layer, the molding layer and the stopping insulating layer;
    partially etching the molding layer to expose parts of the storage electrodes and the supporter layer;
    removing the partially-etched molding layer to expose the stopping insulating layer;
    forming a dielectric layer on the storage electrodes; and
    forming a plate electrode on the dielectric layer.

12. The method of claim 11, further comprising:
    forming a sacrificial oxide layer by naturally oxidizing the exposed parts of the storage electrodes,
    wherein the sacrificial oxide layer is removed while removing the partially-etched molding layer.

* * * * *